United States Patent
Song

(10) Patent No.: US 11,361,802 B2
(45) Date of Patent: Jun. 14, 2022

(54) LOGIC COMPATIBLE EMBEDDED FLASH MEMORY

(71) Applicant: ANAFLASH INC., San Jose, CA (US)

(72) Inventor: Seung-Hwan Song, Palo Alto, CA (US)

(73) Assignee: Anaflash Inc., San Jose, CA (US)

( * ) Notice: Subject to any disclaimer, the term of this patent is extended or adjusted under 35 U.S.C. 154(b) by 0 days.

(21) Appl. No.: 17/173,646

(22) Filed: Feb. 11, 2021

(65) Prior Publication Data

US 2021/0257010 A1   Aug. 19, 2021

Related U.S. Application Data

(63) Continuation of application No. 16/377,227, filed on Apr. 7, 2019, now abandoned.

(60) Provisional application No. 62/655,074, filed on Apr. 9, 2018.

(51) Int. Cl.
| | |
|---|---|
| *G11C 7/10* | (2006.01) |
| *G11C 5/14* | (2006.01) |
| *G11C 16/08* | (2006.01) |
| *G11C 16/16* | (2006.01) |
| *G11C 16/24* | (2006.01) |
| *G06N 3/063* | (2006.01) |
| *G11C 16/30* | (2006.01) |
| *G11C 16/34* | (2006.01) |
| *G11C 11/56* | (2006.01) |
| *G11C 16/26* | (2006.01) |

(52) U.S. Cl.
CPC .......... *G11C 7/1006* (2013.01); *G06N 3/063* (2013.01); *G11C 5/145* (2013.01); *G11C 11/5635* (2013.01); *G11C 11/5642* (2013.01); *G11C 16/08* (2013.01); *G11C 16/16* (2013.01); *G11C 16/24* (2013.01); *G11C 16/26* (2013.01); *G11C 16/30* (2013.01); *G11C 16/3445* (2013.01); *G11C 16/3459* (2013.01)

(58) Field of Classification Search
CPC ... G11C 7/1006; G11C 5/145; G11C 11/5635; G11C 11/5642; G11C 16/08; G11C 16/16; G11C 16/24; G11C 16/26; G11C 16/30; G11C 16/3445; G11C 16/3459; G06N 3/063

See application file for complete search history.

(56) References Cited

U.S. PATENT DOCUMENTS

| | | | | |
|---|---|---|---|---|
| 6,693,483 B2 * | 2/2004 | Demi | ................... | H02M 3/073 |
| | | | | 327/536 |
| 7,436,239 B2 * | 10/2008 | Masuko | ............... | H02M 3/073 |
| | | | | 327/536 |
| 8,598,946 B2 * | 12/2013 | Drost | ................... | H02M 3/073 |
| | | | | 327/536 |

(Continued)

*Primary Examiner* — Vanthu T Nguyen

(57) ABSTRACT

A non-volatile memory combines a data cell and a reference cell. The data cell includes a coupling structure and a transistor stack. The transistor stack is electrically coupled to the coupling structure. The data cell can store data and output a data signal that corresponds to the data. The reference cell includes a transistor stack that has the same structure as that of the data cell and outputs a reference signal. A column circuit is electrically coupled to the data cell and the first reference cell and configured to process the data signal using the reference signal.

13 Claims, 22 Drawing Sheets

(56) References Cited

U.S. PATENT DOCUMENTS

2005/0195019 A1\* 9/2005 Okamoto ............... G11C 5/145
327/536

\* cited by examiner

1440

LOGIC COMPATIBLE EMBEDDED FLASH MEMORY

CROSS-REFERENCE TO PRIOR APPLICATIONS

This is a continuation application of U.S. patent application Ser. No. 16/377,227, filed Apr. 7, 2019, titled "Logic Compatible Embedded Flash Memory," which claims priority of a U.S. provisional application No. 62/655,074, filed on Apr. 9, 2018, which is hereby incorporated by reference in its entirety.

BACKGROUND

A. Technical Field

The present invention relates generally to a flash memory and more particularly, a logic compatible embedded flash memory that can be integrated onto a system-on-chip (SoC).

B. Background of the Invention

An internet-of-things (IoT) SoC integrates various building blocks such as the CPU, sensors, SRAM, and neural network computing engine for intelligent operation in an edge device. An edge device is an end-point device that interacts with and communicate real-time data from smart products or services. Typically, such IoT SoC employs an external flash memory for storing persistent data during power-off period to save standby power. FIG. 1 illustrates a prior art SoC architecture in which the external flash memory (170) is separately attached to the main silicon chip (110) integrating circuit blocks such as the CPU (120), sensors (140), and neural network computing engine (150) that are connected through a system bus (160). External flash memory access is slow due to the external wire capacitance, and parallel access is limited due to the limited pin count of the chip 110. Additionally, there are security issues for off-chip access especially for privacy related neural network parameters. As such, there is a need for cost effective logic-compatible flash memory that can be integrated onto the main silicon chip in a SoC.

SUMMARY OF THE DISCLOSURE

A non-volatile memory combines a data cell and a reference cell. The data cell includes a coupling structure and a transistor stack. The transistor stack is electrically coupled to the coupling structure. The data cell can store data and output a data signal that corresponds to the data. The reference cell includes a transistor stack that has the same structure as that of the data cell and outputs a reference signal. A column circuit is electrically coupled to the data cell and the first reference cell and configured to process the data signal using the reference signal.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purposes of explanation, specific details are set forth in order to provide an understanding of the disclosure. It will be apparent, however, to one skilled in the art that the disclosure may be practiced without these details. One skilled in the art will recognize that embodiments of the present disclosure, described below, may be performed in a variety of ways and using a variety of means. Those skilled in the art will also recognize additional modifications, applications, and embodiments are within the scope thereof, as are additional fields in which the disclosure may provide utility. Accordingly, the embodiments described below are illustrative of specific embodiments of the disclosure and are meant to avoid obscuring the disclosure.

A reference in the specification to "one embodiment" or "an embodiment" means that a particular feature, structure, characteristic, or function described in connection with the embodiment is included in at least one embodiment of the disclosure. The appearance of the phrase "in one embodiment," "in an embodiment," or the like in various places in the specification are not necessarily all referring to the same embodiment.

As discussed above, in conventional prior art IoT SoC architectures, neural network weight parameters are stored in an external flash memory chip. Accessing the external flash memory incurs significant access power and latency as well as security concerns.

Figure 1:
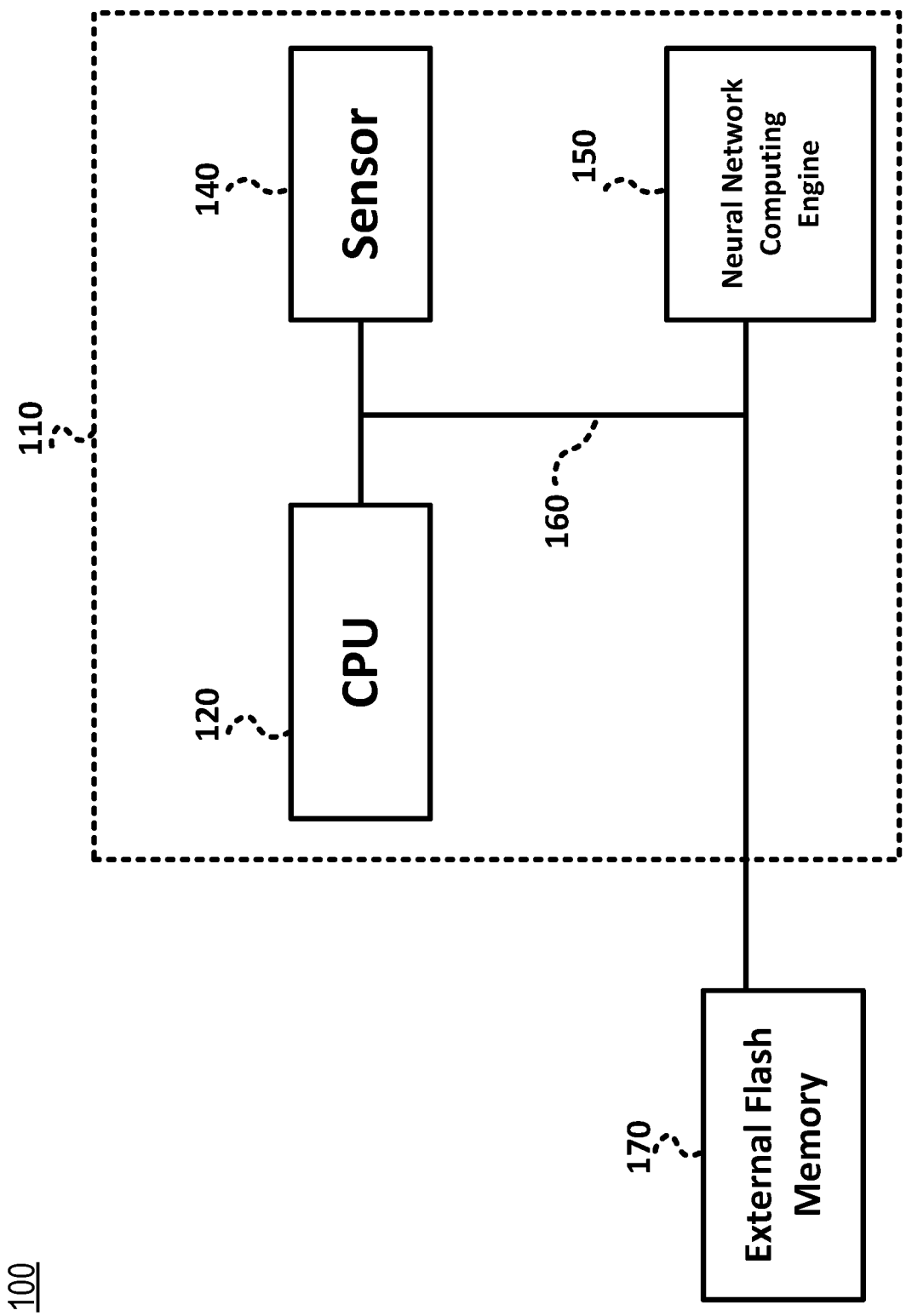
FIG. 1 shows a prior art system-on-chip architecture in which the external flash memory is separated from the main silicon chip.
Figure 2A:
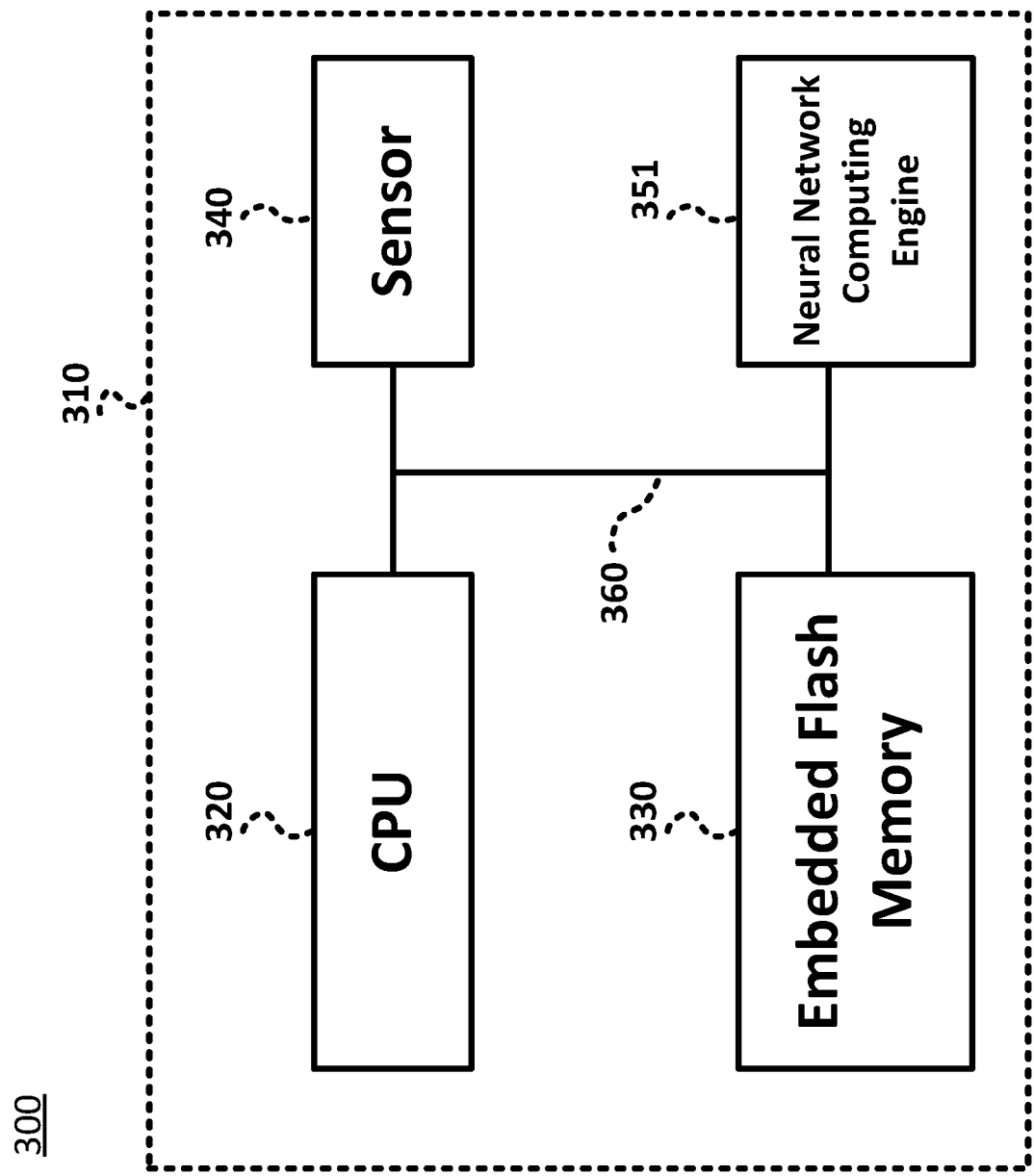
FIG. 2A shows a system-on-chip architecture according to embodiments of the present disclosure.

FIG. 2A shows a SoC architecture according to embodiments of the present disclosure. As depicted, the logic compatible embedded flash memory 330 is integrated in a single silicon chip 310 with other circuit blocks such as the CPU 320, sensors 340, and neural network (NN) computing engine 351 through a system bus 360. "Logic-compatible" means that the flash memory may be fabricated without additional processing compared to the logic and arithmetic circuits used in the CPU. Therefore, the flash memory can be integrated into the SoC easily.

In embodiments of the present disclosure, by integrating flash memory in the SoC itself, the neural network computing engine can remove energy dissipation, latency overhead, and security concern incurred by external flash memory access. The single logic chip solution in the embodiments is cost-effective and attractive for IoT NN applications. The embedded flash is connected through the on-chip high speed system bus Unlike the prior art systems with off-chip access, the I/O width is not limited by the pin counts of the chip, and a wide I/O and low latency memory interface may be used for communicating between the embedded flash memory and other blocks in SoC (300). Thus, neural network computing engine may access data from the embedded flash faster than with external flash memory.

Figure 2B:
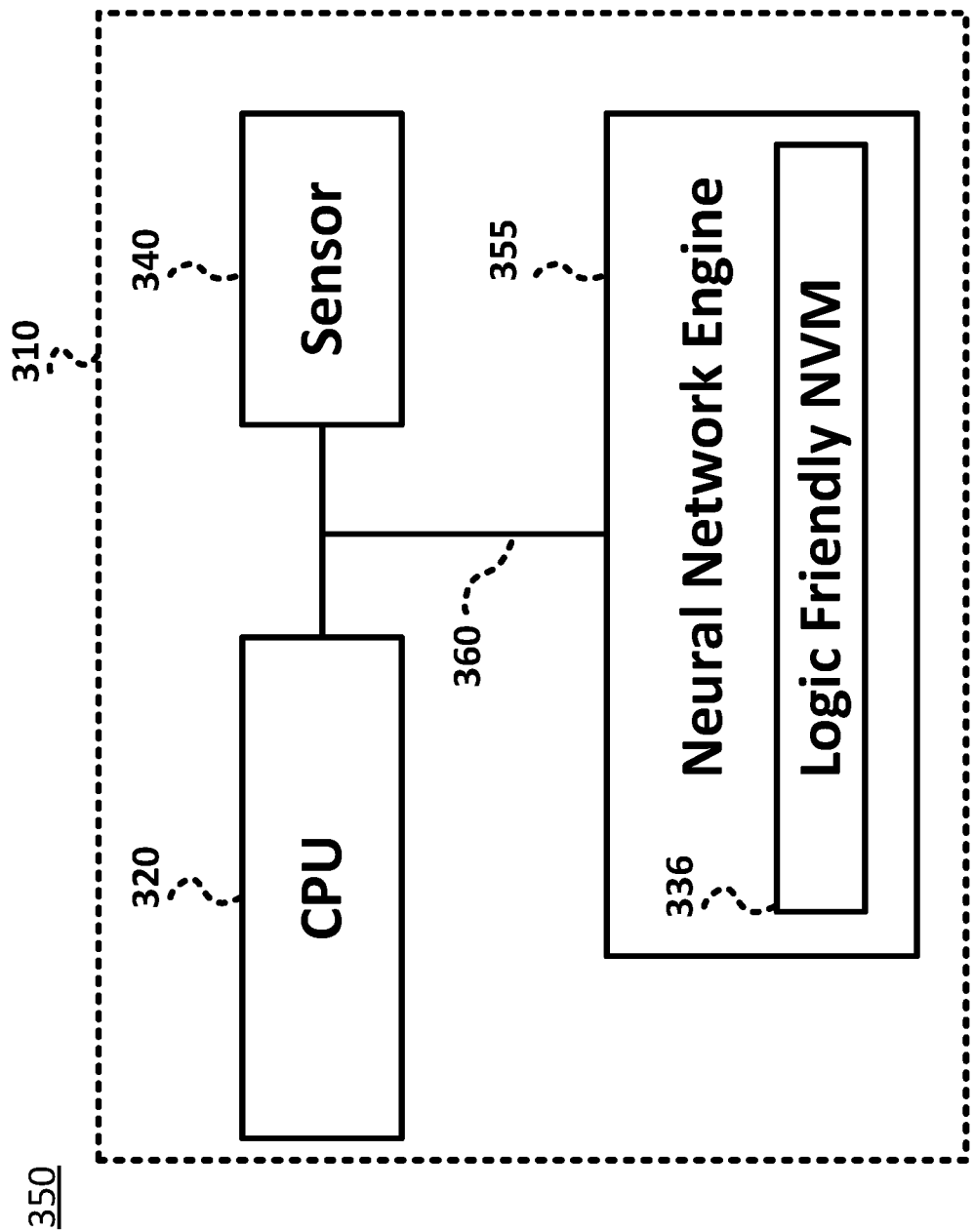
FIG. 2B shows another system-on-chip architecture according to embodiments of the present disclosure.

FIG. 2B shows another system-on-chip architecture 350 according to embodiments of the present disclosure. As depicted, the logic compatible embedded flash memory 336 is integrated into the neural network computing engine 355. The embedded flash memory may be accessed within the engine without CPU intervention for further acceleration of power efficient computation. Furthermore, the logic compatible embedded flash memory in these embodiments may emulate neural network synapses and perform in-memory calculations of the neural network computations.

Figure 3:
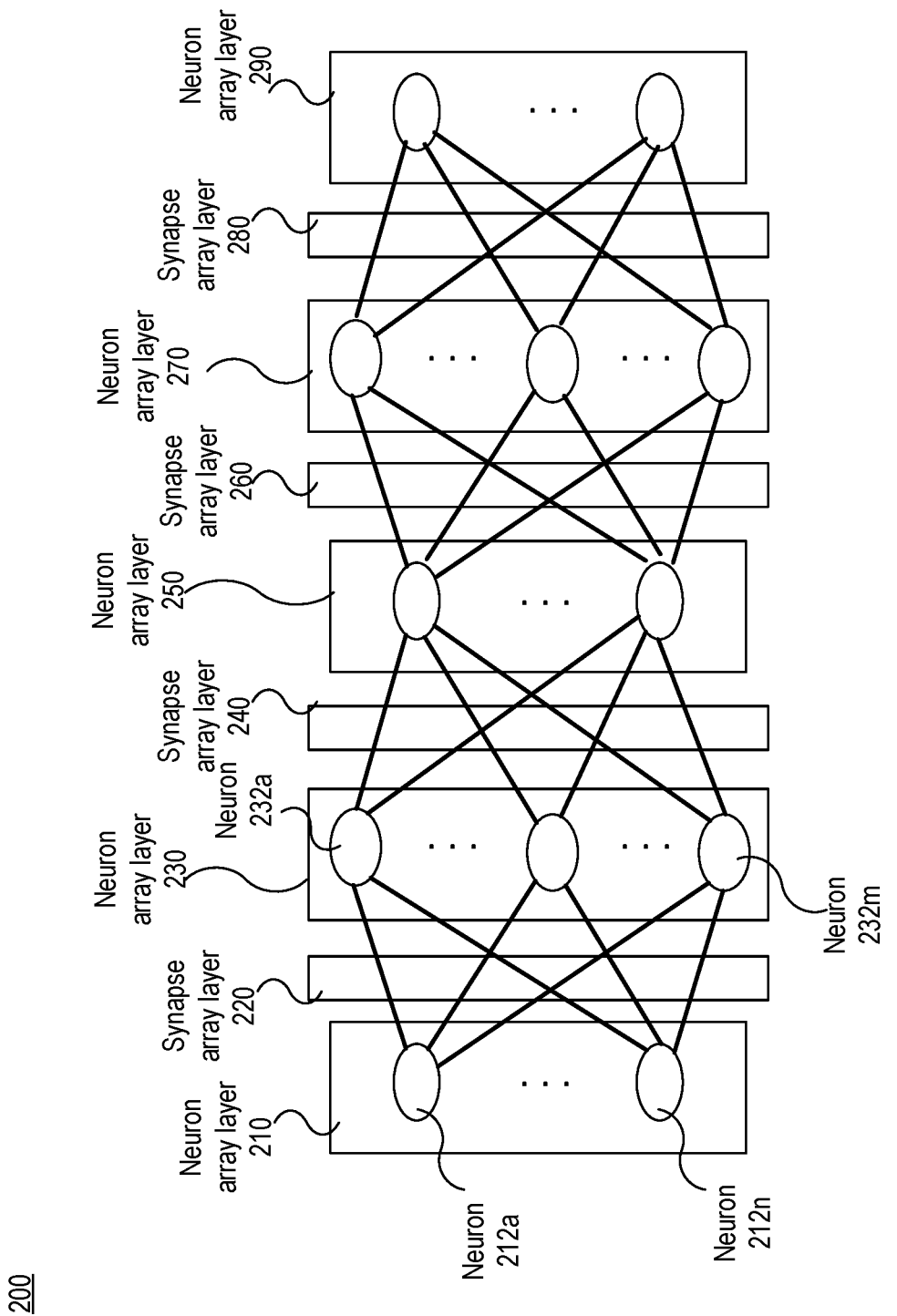
FIG. 3 shows a neural network composed of multiple neuron array layers and synapse array layers according to embodiments of the present disclosure.

An example neural network architecture 200 according to the embodiments of the present disclosure is illustrated in FIG. 3 where the neural network is composed of multiple neuron array layers 210, 230, 250, 270, and 290 and synapse array layers 220, 240, 260, and 280. Each neuron array layer is shown with multiple neurons (e.g. 212, 232) that are connected through synapses. The connection strength of each synapse, a weight parameter, is trained during a learning process. The trained parameters are stored in flash memory for later execution. Such neural networks may be moderately sized and integrated in a single chip. For example, power management policy of IoT SoC may be smartly adjusted using intelligent dynamic voltage frequency scaling schemes with a moderate density neural network having below five hundred thousand neural network parameters. Other moderate density neural network applications include smart scheduling of CPU instructions, face detection, bio-authentication, and trigger word detection of the smart IoT edge devices.

In the embodiments of the present disclosure, we propose a system using cost-effective logic compatible embedded flash memory that may be integrated onto a SoC. The embedded flash memory system is suitable for moderate density neural network applications. By integrating logic compatible embedded flash memory into a SoC, moderate density neural network computing engine may remove energy dissipation, latency overhead, and security concerns that occur with external flash memory access. The sensing circuits of the logic compatible embedded flash cell in embodiments may achieve high sensing speeds. The operating method in the embodiments for managing an overstress free 4×VDD switching WL driver circuit may achieve high speed programming without WL driver circuit reliability concerns. With the high voltage generator circuit in the embodiments, approximately VDD, 2×VDD, 3×VDD, 4×VDD level may be generated simultaneously without voltage overdrive. The proposed VPP switch circuit may provide appropriate supply levels to the 4×VDD switching WL driver circuit and provide proper biasing of inter-stage voltage levels to the proposed high voltage generator circuit.

Figure 4:
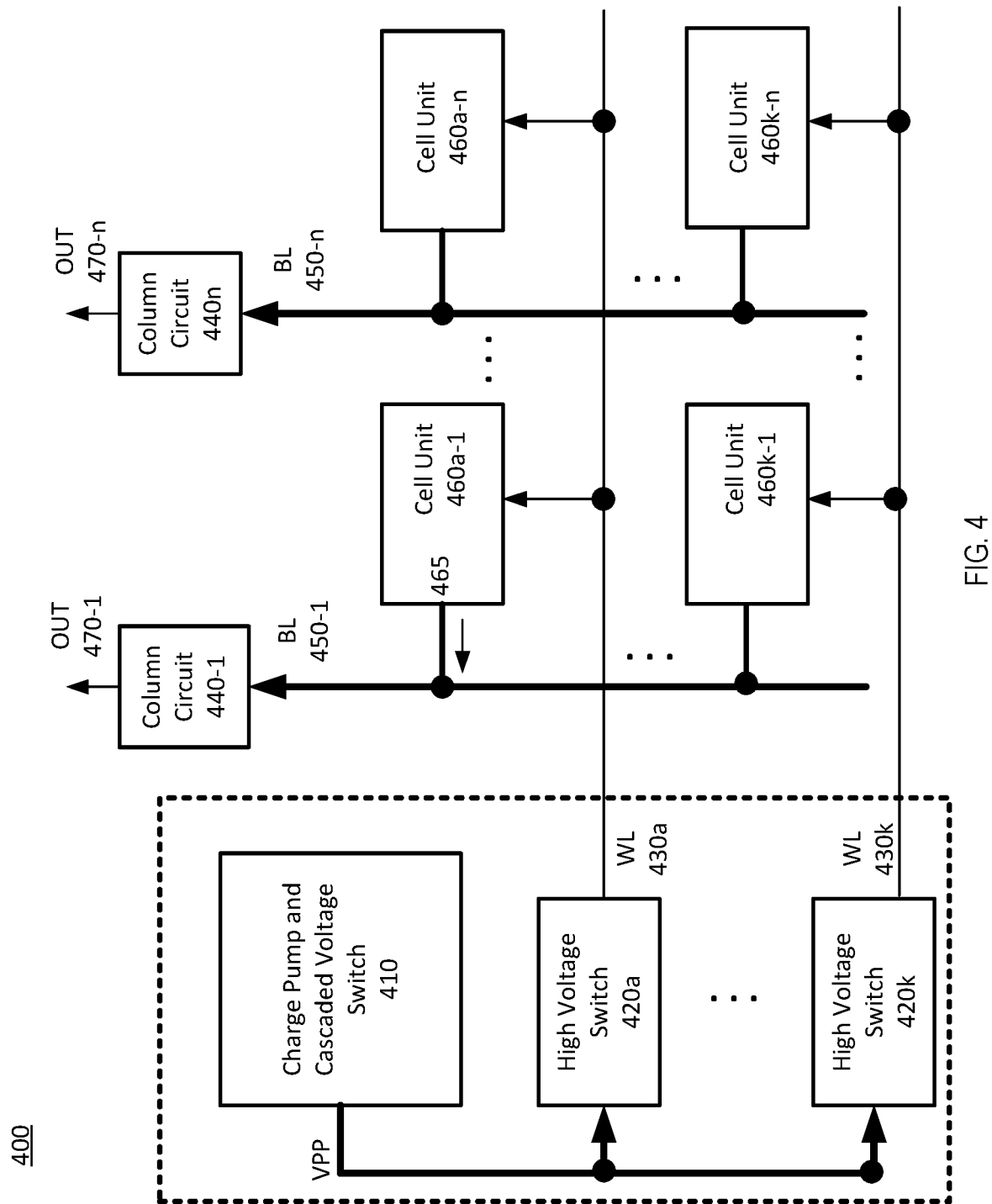
FIG. 4 shows a schematic diagram of a flash memory cell array according to embodiments of the present disclosure.

FIG. 4 shows a non-volatile memory (NVM) cell array 400 according to embodiments of the present disclosure. As depicted, the NVM cell units 460 (hereinafter, the term "cell unit," or "cell" are used interchangeably) are arranged into rows and columns. By way of example, FIG. 4 shows n×k number of cells arranged into a two dimensional array. Each cell is addressed by its row-column.

The array 400 has a charge pump and cascaded voltage switch 410 which supplies power at one or more voltage levels to the high voltage switches 420. Each high voltage switch (e.g. 420a) is electrically coupled to a row of cells through word line WL (e.g., 430a). Word line WL (e.g., 430a) may provide electrical signals to each cell in the row. Each row of cells may have one or more high voltage switches and corresponding word lines. By way of example, the signals provided to the row of cells may include a data input signal (that may correspond to the input value from a neuron in a neural network application according to the embodiments), a reference voltage signal, a programming/write voltage signal, an erase signal, and other signals to the cell unit depending on the application and cell unit design. By way of example, a high voltage switch 420a is electrically coupled to the cell units of row a (460a-1 through 460a-n) through a WL 430a and high voltage switch 420k is electrically coupled to the cell units of row k (460k-1 through 460k-n) through WL 430k.

Each cell (e.g., 460a-1) is composed of non-volatile memory and may store a value. In embodiments, the cell may store the weight parameter of a synapse. Each cell has an output 465 representing one or more output signals. The output signals from the cells in a column of the array 400 (e.g., 460a-1 through 460k-1) are electrically coupled to one or more bit-lines represented by BL 450. By way of example, the bit-lines BL 450-1 are electrically coupled to each of the outputs from the cells in column 1 (cells 460a-1 through 460k-1). BL 450-n is electrically coupled to each of the outputs from cells in column n (cells 460a-n through 460k-n).

The bit-lines (e.g., BL 450-1), electrically couple the outputs from the column of cells to a column circuit (e.g., 440-1). The column circuit converts input signals from its coupled bit lines (e.g., BL 450-1) into a column output (e.g., OUT 470-1). By way of example, column circuit 440m provides the column output signal 470m from the cells of column m (460a-m and 460b-m). Likewise, column circuit 440n provides the column output signal 470n from the cells of column n (460a-n and 460b-n).

In a neural network application, according to embodiments of the present disclosure, an output signal on one of the bit-lines in BL 450-1 may represent the sum of the output values from the cells in the column (460a-1 through 460k-1). By way of example, he output signal from each cell may be an electrical current signal, and the electrical current value on the bit-line may be the sum of the current values output from each of cells of column 1.

It is noted that, in embodiments, separate circuits (not shown in FIG. 4) may be included to perform auxiliary functions such as: (1) decoding an address of a specific cell select the specific high voltage switch 420 and WL 430 for the row of the cell, as well as selecting the specific column of the cell, (2) a driving circuit that drives the input signals to the appropriate high voltage switch and its row of cells, and (3) circuits further converting the output signals 470 as well as other auxiliary functions.

Figure 5:
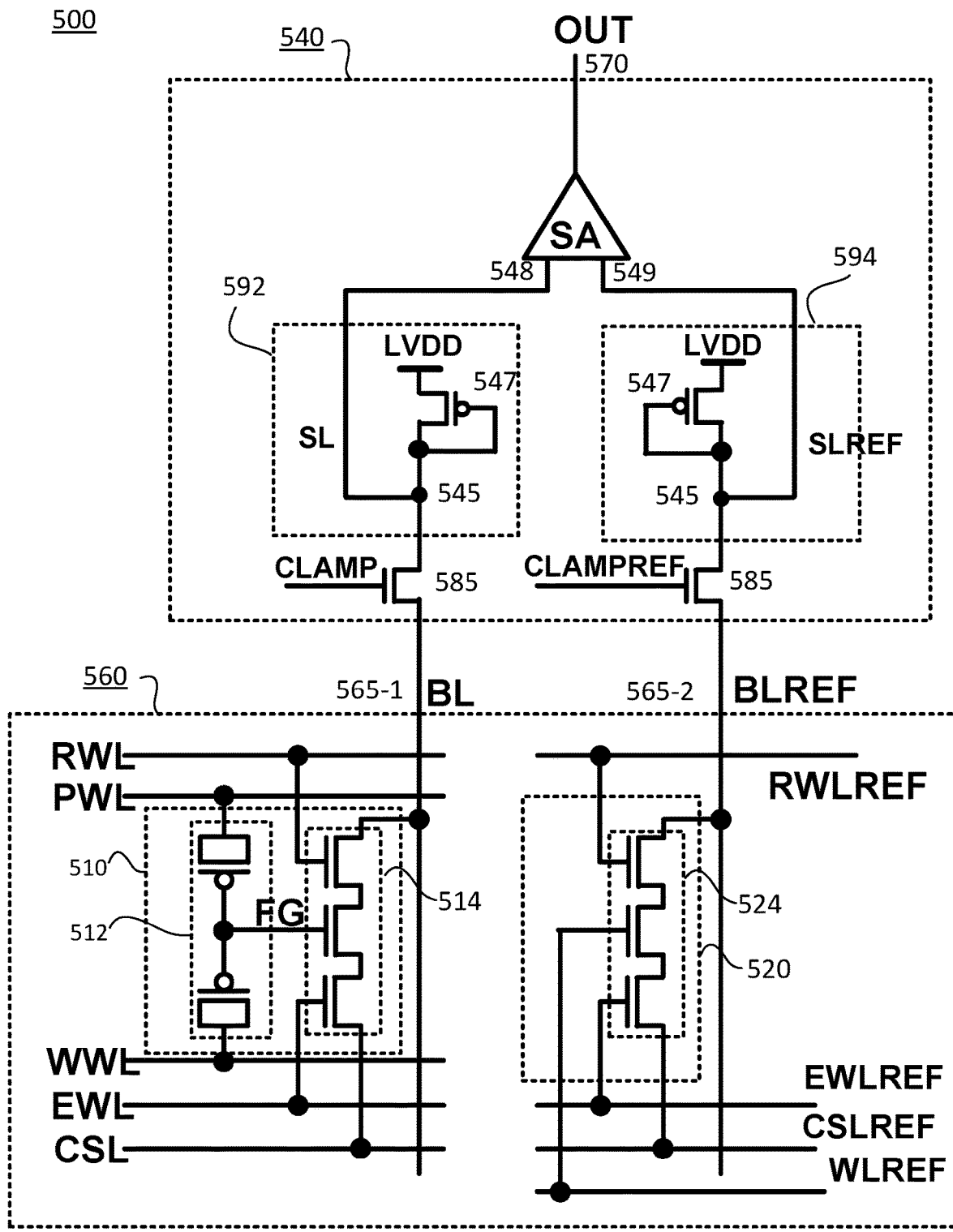
FIG. 5 shows a schematic diagram of a flash memory cell with reference cell according to embodiments of the present disclosure.

FIG. 5 shows a schematic diagram 500 of a cell unit 560 and column circuit 540 according to the embodiments of the present disclosure. The cell unit 560 may be used as one of the cell units 460 (e.g., 460a-1) in FIG. 4 and column circuit 540 may be used as one of the column circuits (e.g., 440-1) in FIG. 4. As depicted in FIG. 5, multiple word lines provide input signals to cell 560. They include a RWL (read word line, or read line), a PWL (program word line, or program line), a WWL (write word line, or write line), a EWL (erase word line, or erase line), a CSL (common source line), a RWLREF (reference read line), a EWLREF (reference erase line), a CSLREF (reference common source line), and a WLREF (reference cell line). The cell outputs bit-lines BL 565-1 and BLREF 565-2. The column circuit 540 receives both the BL and BLREF signals to produce an output signal 570.

As depicted, cell 560 is comprised of a data cell 510 and a reference cell 520. The BL 565-1 is electrically coupled to the data cell 510 and serves as its output bit-line. Likewise, BLREF 565-2 is electrically coupled to the reference cell 520 as its output bit-line. The data cell 510 is electrically coupled to the RWL, PWL, WWL, EWL, and the CSL lines. The reference cell 520 is coupled to the RWLREF, EWLREF, CSLREF, and the WLREF lines.

The data cell 510 is comprised of a coupling structure 512 and a transistor stack (also "NMOS string," or "string") 514 where the coupling structure and the transistor stack are connected through the floating gate node FG. The transistor stack 514 is comprised of one or more transistors disposed in a series between the CSL line and BL output line. The uppermost transistor of the stack 514, with a gate terminal electrically coupled to the RWL and a drain terminal electrically coupled to the BL is defined as an upper select transistor. The transistor with a gate terminal electrically coupled to the floating gate FG is a read transistor. The lowermost transistor with a source coupled to the CSL and a gate terminal coupled to the EWL is the lower select transistor.

The coupling structure 512 is comprised of a coupling transistor coupled to the PWL and a write transistor coupled to the WWL. The floating gate FG may store a threshold voltage setting of the cell that may be programmed by electrical signals via the PWL and WWL.

In the transistor stack 514, the upper select transistor may function as a switch for the BL while the lower select transistor may function as a switch for the CSL. In embodiments, the conductance of the read transistor is determined by the threshold voltage setting of the floating gate FG. As depicted in FIG. 5, the output signal on BL from the data cell is a current signal that is determined by the RWL, EWL, CSL signals to the upper and lower select transistors of the transistor stack, and the conductance of the read transistor.

The reference cell 520 is comprised of a transistor stack 524 that is disposed between the CSLREF and BLREF output line. The transistor stack 524 has the same structure as the transistor stack 514 of the data cell. In the upper select transistor, the gate terminal is coupled to RWLREF and the drain terminal is coupled to the BLREF output line. In the lower select transistor, the gate terminal is electrically coupled to the EWLREF and source terminal is electrically coupled to the CSLREF. The RWLREF, EWLREF, CSLREF signals have similar signal values and durations to the RWL, EWL, CSL signals so that the data cell and the reference cell may operate under similar bias condition.

In the embodiments, as depicted in FIG. 5, the reference cell 520 does not have a floating gate node. In the read transistor of transistor stack 524, the gate terminal of the read transistor in the reference cell is coupled to the WLREF word line. The voltage level of the WLREF word line coupled to the read transistor of the reference cell 520 transistor stack 524, corresponds to the specific threshold voltage setting of the floating gate in the data cell. The transistor stack 524 of the reference cell 520 mimics the transistor stack 514 of its corresponding data cell 510. The WLREF voltage serves as a reference value for the threshold voltage of the floating gate and correspondingly, the output current signal on BLREF 565-2 serves as a reference value for the current signal on BL 565-1. The output bit-lines BL and BLREF are coupled to the column circuit 540 and may provide current signal inputs to the column circuit 540.

Column circuit 540 is comprised of clamp transistors 585 for each of the bit-lines, BL 565-1 and BLREF 565-2. Each bit-line is electrically coupled to the source terminal of its corresponding clamp transistor 585. A clamp signal (CLAMP or CLAMP_REF) to drive the clamp transistor 585 is electrically coupled to the gate terminal. The drain terminal of the clamp transistor is electrically coupled to a converting circuit (e.g., 592 and 594) that converts the current signal into a voltage signal.

Converting circuit 592 converts the data signal from the data cell into a data voltage signal. Converting circuit 594 converts the reference signal into a reference voltage signal. The converting circuits 592 and 594 are coupled to sense amplifier SA via sense-lines SL and SLREF.

The voltage sense amplifier has a data signal input 548, and a reference signal input 549. The sense-line SL carrying the data voltage signal from the data cell is coupled to the data signal input 548 and the sense-line SLREF carrying the reference voltage signal from the reference cell is coupled to the reference signal input 549.

In this manner, the voltage sense amplifier SA receives the voltage signals corresponding to each of the bit-line current signals on BL and BLREF through their corresponding sense-lines, SL and SLREF. The sense amplifier SA produces an output signal OUT 570 based on a comparison of the signals from the SL and SLREF sense-lines. The output signal 570 in FIG. 5 corresponds to the output signal 470 in FIG. 4.

As depicted in FIG. 5, by way of example, the converting circuits 592 and 594 are further comprised of a load transistor junction 545, and a load transistor 547. The bit line (e.g., BL or BLREF), the sense-line (e.g., SL or SLREF) and the drain terminal of a load transistor 547 are coupled at the load transistor junction. The source terminal of the load transistor 547 is coupled with a voltage source LVDD.

The load transistors convert the current signals from their corresponding clamped bit-line (BL or BLREF) into a voltage signal carried on the corresponding sense-lines (SL or SLREF) to the sense amplifier. As depicted in FIG. 5, the load transistors 547 are illustrated as a diode connected transistor. Other components that convert the current signal on the bit-line into a voltage signal on the sense-line may also be used.

The WLREF voltage level may be calibrated after fabrication or at run-time and stored in a programmable register. The WLREF voltage may be adjusted according to the PWL and WWL voltages used to set the floating gate threshold voltage in the data cell. The WLREF may be further optimized to maximize the sensing margin and minimize errors due to variations of the fabrication. To maximize the sensing margin, the data cell and reference cells are operated at a range where the output currents change linearly to BL and BLREF voltages, respectively.

The clamping transistors 585 between the bit-lines (BL and BLREF) and sense-lines (SL and SLREF) enable large swings of the sense-line voltage with small swings of the bit-line voltage. The parasitic capacitance of the sense-lines is much smaller than that of the bit-lines, and thus, high speed sensing is possible.

Figure 6:
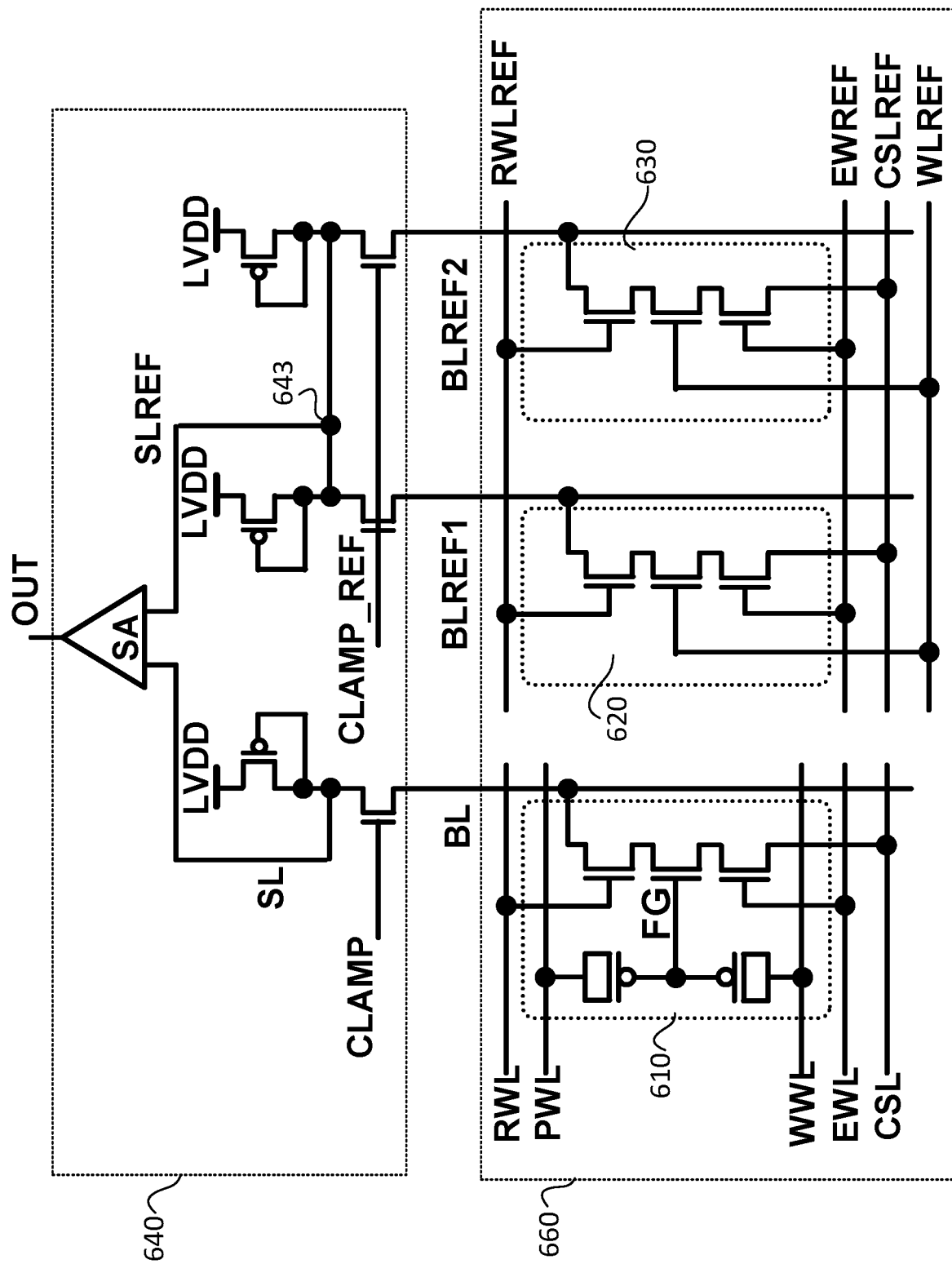
FIG. 6 shows another schematic diagram of a flash memory cell with reference cell according to embodiments of the present disclosure.

FIG. 6 shows a schematic diagram 600 of a cell unit 660 and a column circuit 640 according to embodiments in the present disclosure. The cell unit 660 and column circuit 640 may be used as a cell unit (e.g., 460*a*-1) and column circuits (e.g., 440-1) in FIG. 4, respectively. Cell unit 660 is similar to cell unit 560 depicted in FIG. 5, with the difference that it has additional reference cells (e.g., 630). By averaging the output, errors due to reference cell variation may be controlled and a more reliable reference voltage signal may be provided to the sense amplifier SA of the column circuit 640.

As depicted in FIG. 6, additional reference cells (e.g., 630) are connected in parallel to reference cell 620, which corresponds to reference cell 520 in FIG. 5 (the 'first reference cell'). The additional reference cells receive the same signals as the first reference cell 620 through the RWLREF, EWLREF, CSLREF, and WLREF word lines.

Each additional reference cell in FIG. 6 has its own BLREF output line (e.g., BLREF2 coupled with reference cell 630) which provides an input signal to the column circuit 640.

As depicted in FIG. 6, the column circuit 640 has an additional clamping transistor, load transistor, and a sense-line corresponding to each additional bit-line from the cell unit 660. As in FIG. 5, each sense-line and load transistor are coupled to their corresponding bit-line at a load transistor junction, and each of the sense-lines carry a voltage signal converted from the current signal of its corresponding bit-line. The sense-lines corresponding to the reference cells are combined into a single reference sense-line SLREF at a sense-line junction 643. The sense-line junction is coupled to the reference signal input of the sense amplifier SA. The voltage signal on the SLREF carries the average voltage of the sense-lines that are combined at the sense-line junction.

Figure 7:
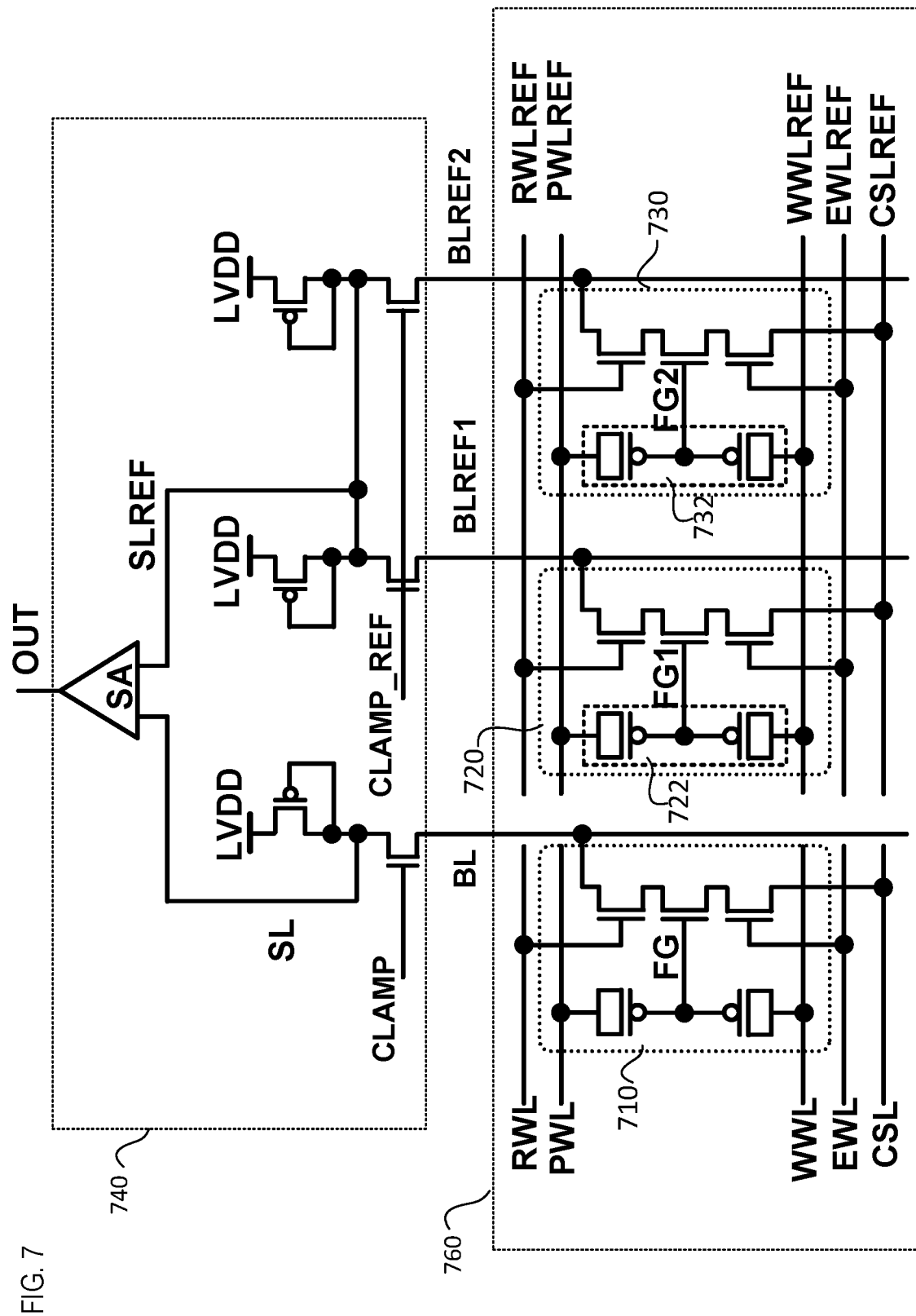
FIG. 7 shows another schematic diagram of a flash memory cell with reference cell according to embodiments of the present disclosure.

FIG. 7 shows a schematic of a cell unit 760 according to embodiments of the present disclosure. The cell 760 is similar to the cell 660, with the difference that the reference cells also have coupling structures (e.g., 722 and 732) including the floating gate (e.g., FG1 and FG2) as well as the transistor stacks. The reference cells 720 and 730 do not require a WLREF word line but have word lines PWLREF, WWLREF lines to program their floating gates (FG1 and FG2). The floating gate threshold voltage of the reference cells in cell unit 760 are programmed to minimize errors due to variations of the cells and set at levels to maximize the sensing margin in a manner like the way that the WLREF voltage is optimized in the cell unit 660 of FIG. 6 and cell unit 560 of FIG. 5.

In embodiments, FIG. 7 depicts a cell unit 760 with two reference cells. Variations of cell unit 760 may be designed to have only one reference cell similar to cell unit 560 of FIG. 5.

FIG. 7, as depicted, shows a column circuit 740 that is identical to the column circuit 640 in FIG. 6. If the cell unit 760 is modified to have only one reference cell, the column circuit 740 may be modified to be identical to column circuit 540 in FIG. 5.

It will be evident to those of ordinary skill in the art that the reference cells and data cells depicted in FIGS. 5-7 may be coupled to the same high voltage switch 420. In this configuration, the corresponding word lines (e.g., RWL and RWLREF, EWL and EWLREF, CSL and CSLREF in FIG. 5) lines may be identical lines.

Alternatively, the reference cells in FIGS. 5-7 may be placed in a separate cell unit that does not include a data cell. The BLREF output signals from these reference cell units may be shared by one or more cell units that only have data cells. Other configurations of reference cells and data cells that may address different design requirements will also be evident to those skilled in the arts.

To program a data cell (510, 610, or 710) in FIGS. 5-7 (or to program reference cells 720 or 730 in FIG. 7), the PWL and WWL word lines are driven to about 3 to 4 times the VDD level. At such high voltages, the electrons are injected into the floating gate (e.g., FG, FG1, or FG2), increasing its threshold voltage.

To erase a data cell, the WWL line is driven to about 3 to 4 times the VDD. Electrons are ejected from the floating gate. The erase word line (EWL) and the reference erase word line (EWLREF) can be driven to the VDD to turn on the lower select transistor of the transistor stack (i.e. 512 or 524) so that the source terminal of the read transistor of the transistor stack is coupled to the low voltage node (i.e. CSL and CSLREF) to enhance the coupling ratio of the memory cell for erase operation. With this enhanced bias condition, erase operation can be done more efficiently, since the floating gate node (FG) is coupled to the low voltage node.

After a floating gate is programmed or erased, a verify-read operation may be performed to ensure that the threshold voltage is set properly, with enough margin between a programmed and erased state. The voltage levels for the verify-read may be set at ⅔×VDD for the programmed cell, and 0 V for the erased cell.

The standard read voltage levels may be set ⅓×VDD for both the PWL and WWL lines. This setting may maximize the sensing margin since it is the middle level between the verify-read levels for the programmed cell and the erased cell. Both the verify-read and standard read voltage levels may be calibrated after fabrication or at run-time to maximize sensing margins and manage variations of the cell characteristics. The values may be stored in a programmable register.

Unprogrammed main cells may be programmed before an erase operation to avoid deep erase. This may be achieved easily by applying "read operation", "flipping read data", and "program operation", before every erase operation. The ability to perform a verify-read operation capability during high voltage mode allows such sequences to be finished quickly without a need to turn off the charge pump for a read operation and then turn on the charge pump for program operation. To quickly initialize the array status, all the cells in the memory array may be driven to the erase pulse or program pulse together, by activating all WWL's (for erase) or all PWL and WWL's (for program) in the array simultaneously.

Figure 8A:
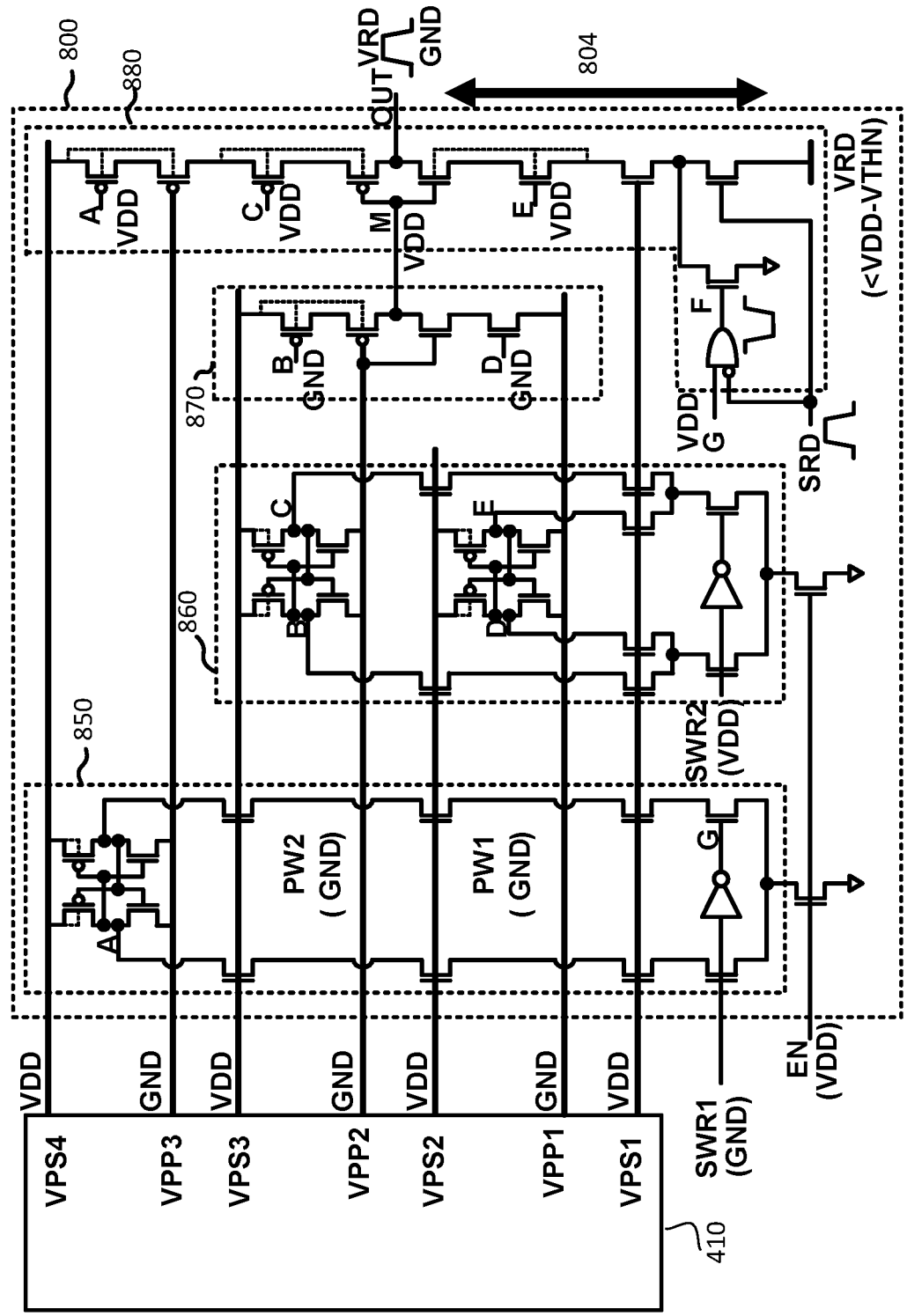
FIG. 8A shows an exemplary standard read operation for a high voltage switch to generate a read voltage for a flash memory cell according to embodiments of the present disclosure.
Figure 8B:
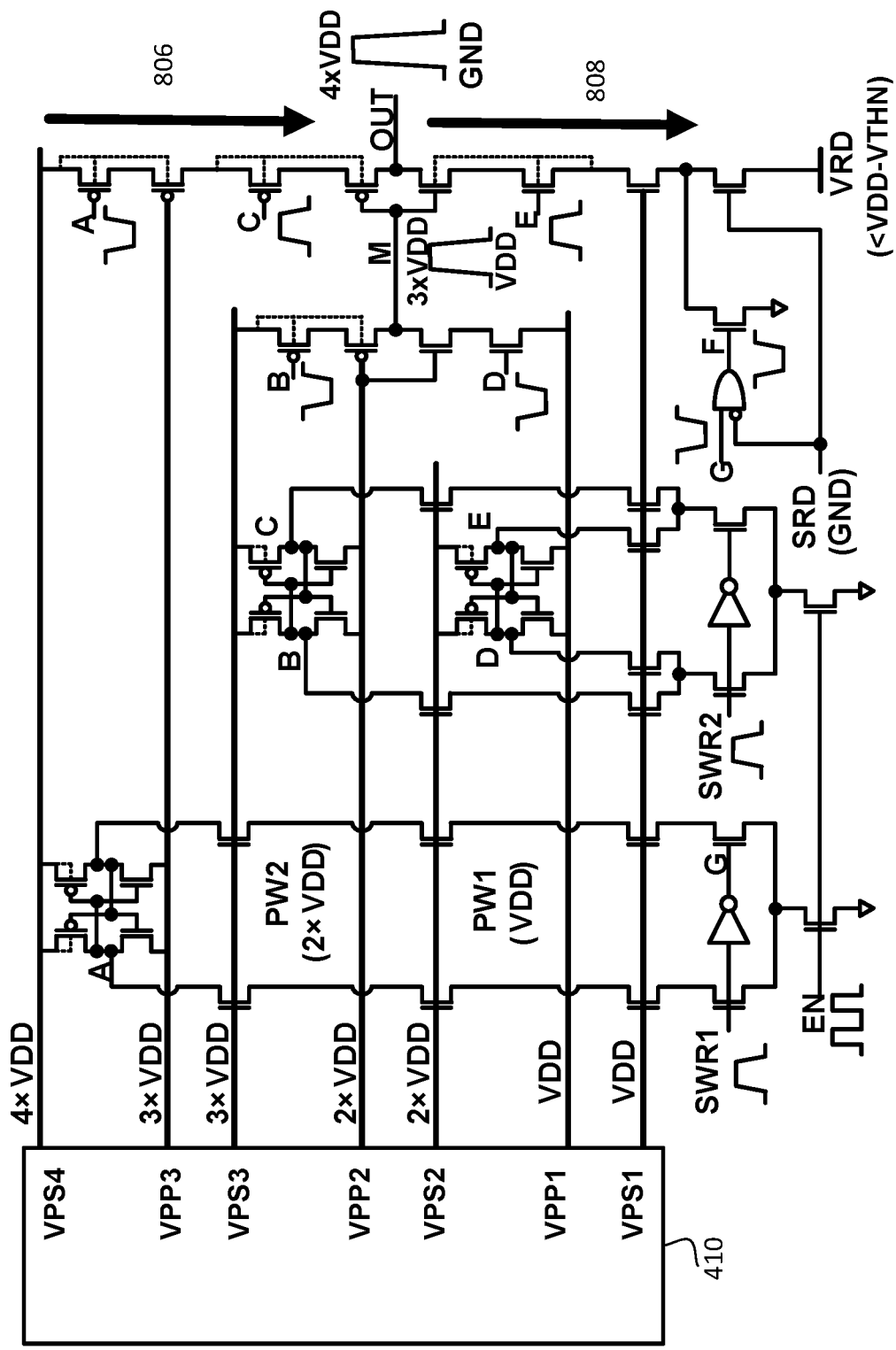
FIG. 8B shows an exemplary program/erase operation for a high voltage switch to generate a program/erase voltage for a flash memory cell according to embodiments of the present disclosure.
Figure 8C:
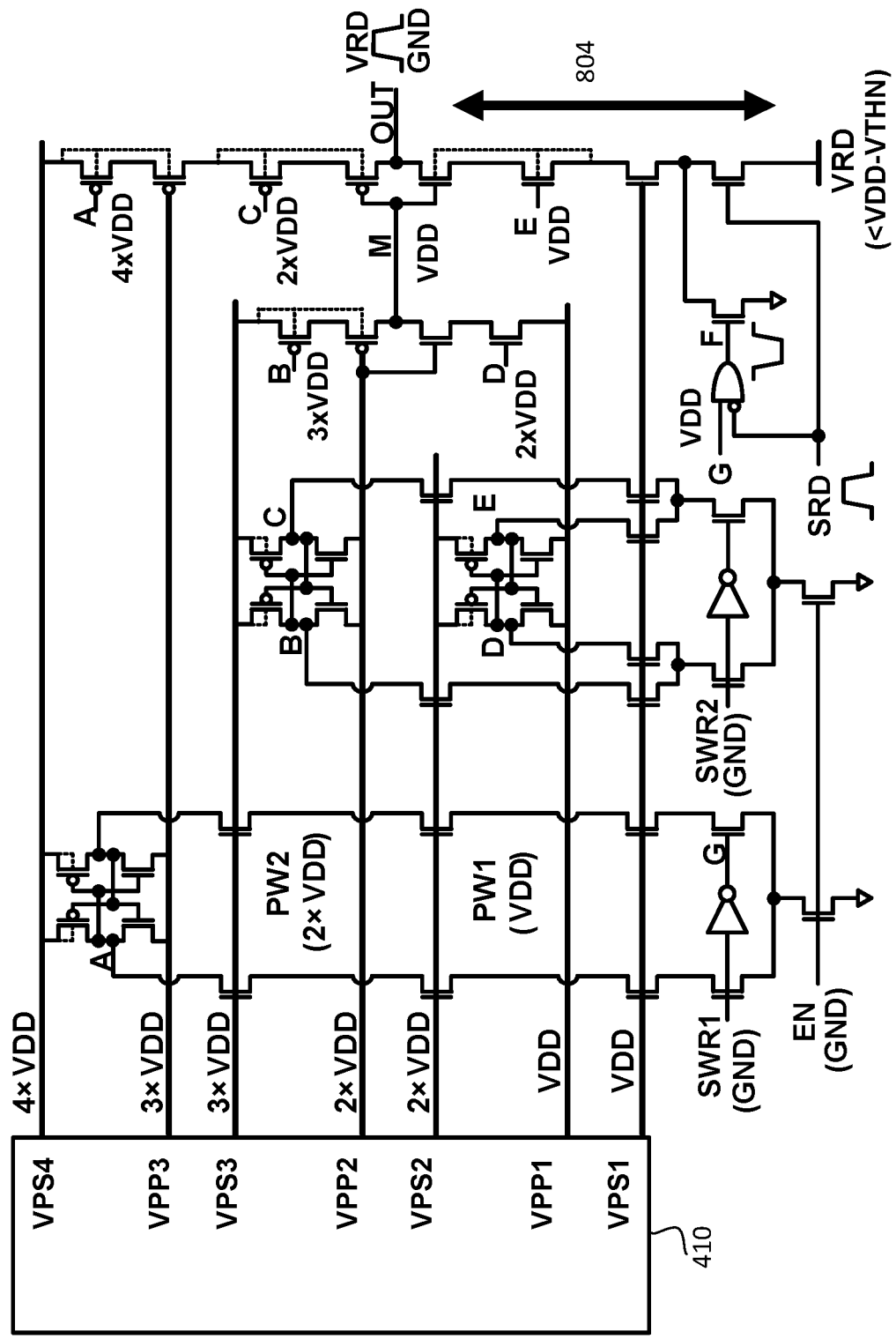
FIG. 8C shows a verify-read operation for a high voltage switch to generate a read voltage for a flash memory cell, even while program/erase voltages are supplied according to embodiments of the present disclosure.

The high voltage switches (e.g., 420a) driving the PWL or WWL lines may provide both the high voltages (3 to 4 times VDD levels) required for programming and erase operations as well as the read voltages. FIGS. 8A-8C shows a schematic diagram of a 4×VDD switch 800 according to the embodiments of the present disclosure. As depicted, show operating methods for providing standard read, program/erase, and verify-read voltage outputs from a 4×VDD switch 800. The 4×VDD switch 800 may be used as a high voltage switch (e.g., 420a) in FIG. 4. The 4×VDD switch 800 is connected to a charge pump and cascaded voltage switch 410 that supplies power through supply lines VPS1 through VPS4, and VPP1 through VPP3.

As depicted in FIGS. 8A-8C, 4×VDD switch 800 is comprised of a first latch stage 850, a second latch stage 860, an M-node driver stage 870 and an output driver stage 880. The input signals to the 4×VDD switch 800 are SWR1 coupled to the first latch 850, SWR2 coupled to the second latch stage 860, an EN (enable) signal coupled to both the first latch stage 850 and second latch stage 860, and an SRD signal coupled to the output driver stage 880. The output signal from the OUT node is used as a word line 430 to a row of cell units in FIG. 4, or by way of example, the PWL word line in FIGS. 5-7.

The first latch stage 850 is comprised of a latch electrically coupled between the VPS4 and VPP3 supply lines. The latch is coupled to the A node of the output driver stage 880.

The second latch stage is further comprised of two latches electrically coupled to the VPS3 and VPP2 lines and the VPS2 and VPP1 lines respectively. The VPS3 latch is coupled to the B node of the M-node driver, and the C node of the output driver stage. The VPS2 latch is coupled to the D node of the M-node driver and the E node of the output driver stage.

The M-node driver 870 is further comprised of B and D nodes and coupled to VPP1, VPP2 and VPS3 supply lines, and an M node that is coupled to the OUT node. The B node is comprised of PMOS transistors, and the D node is comprised of NMOS transistors.

The output driver stage 880 is further comprised of transistors of which the gates are coupled to the A, C, E, and F nodes. The transistors with gates coupled to the A and C nodes are PMOS transistors, and the PMOS transistors are coupled in a series between the VPS4 supply line and the OUT node. The OUT node is then coupled to the E and F nodes. Transistors with gates coupled to the E and F nodes are NMOS transistors, and the NMOS transistors are coupled in a series between the OUT node and the ground. An inverted SWR1 signal is provided from the first latch stage to the output driver stage 880 at node G. An SRD input is also provided to the output driver stage 880.

FIG. 8A shows an exemplary standard read operation for the 4×VDD switch 800 when the charge pump is powered off. VPS1-4 are set to VDD and the VPP1-4 supply lines are set to GND. The SWR1 is set to GND for the first latch stage 850, and the SWR2 input is set to VDD for the second latch stage 860. SRD receives a read signal pulse. The three latches maintain the suitable states for driving the correct bias on the output driver stage 880. As depicted in FIG. 8A, when SRD goes to high, OUT is charged to VRD (read voltage) level through the NMOS string in the driver stage. When SRD goes to low, OUT is discharged to GND through NMOS device of the F node in the driver stage. The arrow 804 depicts the path in the output driver stage for charging and discharging the OUT node during the standard read operation.

The VRD level is designed to be much lower than VDD-VTHN (=threshold voltage of the NMOS device) so that the OUT node may be charged quickly. VRD level may be calibrated after fabricated or run-time by setting programmable register to maximize sensing margin and manage variations of the cell characteristic.

FIG. 8B shows an exemplary program/erase operation for the 4×VDD switch 800 according the embodiments of the present disclosure. The output voltage is driven to 4×VDD required for the PWL and WWL lines to program the threshold voltage stored in the floating gate nodes depicted in FIGS. 5-7, and the 4×VDD level required for the WWL lines to erase the floating gate nodes.

In embodiments, the VPS1 through VPS4 supply lines are boosted to 1×VDD, 2×VDD, 3×VDD, and 4×VDD voltage levels. The VPP1 through VPP3 supply lines are also boosted to 1×VDD, 2×VDD, 3×VDD levels as shown. The EN input receives an enable signal, and SWR1 and SWR2 receive input signals. When SWR1 and SWR2 rise from GND to VDD, the nodes A, B, D, and F are discharged to 3×VDD, 2×VDD, VDD, and GND respectively. The E and C nodes are pulled up to 2×VDD and 3×VDD respectively. This pulls up M to 3×VDD and OUT to 4×VDD. When the opposite transition on SWR1 and SWR2 occur, the opposite transitions occur and M and OUT are pulled down to VDD and GND levels.

The arrow 806 depicts the path in the output driver stage for charging the OUT node up to 4×VDD, and the arrow 808 depicts the path in the output driver for discharging the OUT node back to GND. In this manner the switch 800 creates a 4×VDD pulse. The 4×VDD pulse meets requirements for the PWL and WWL word lines used to program and erase the floating gate nodes.

When programming the floating gate nodes, after a program/erase operation, the current threshold voltage may be verified whether it has reached the targeted level. The standard read operation is not feasible because it requires the charge pump 410 to be powered off and the charge pump and cascaded voltage switch 410 take much longer for the voltage levels to return to the VDD and GND levels from the boosted levels than it takes to perform a read operation.

FIG. 8C shows a method for obtaining a verify-read voltage output on the OUT node of the 4×VDD switch 800 according to embodiments of the present disclosure. In embodiments, the verify-read voltage output may be obtained, even when the charge pump and cascaded voltage switch 410 is powered on and the boosted voltage levels are present on the VPS1-VPS4 and VPP1-VPP3 supply lines.

In embodiments, the SWR1, SWR2, and EN inputs are set to GND. A read signal pulse is input to SRD. Although boosted voltages are present, charging and discharging of the OUT node occurs only through the same NMOS transistor strings of the output driver stage as the standard read. In FIG. 8C, arrow 804, identical to arrow 804 in FIG. 8A shows that the same path for charging and discharging the OUT node is used in the verify-read operation.

In embodiments, the method shown in FIG. 8C may be used to execute a verify read operations without powering off the charge pump and cascaded voltage switch 410 and waiting for the voltage levels to return to the standard read voltages. Also, further programming or erasing may be performed immediately after a verify read operation since the charge pump is still on.

Figure 9A:
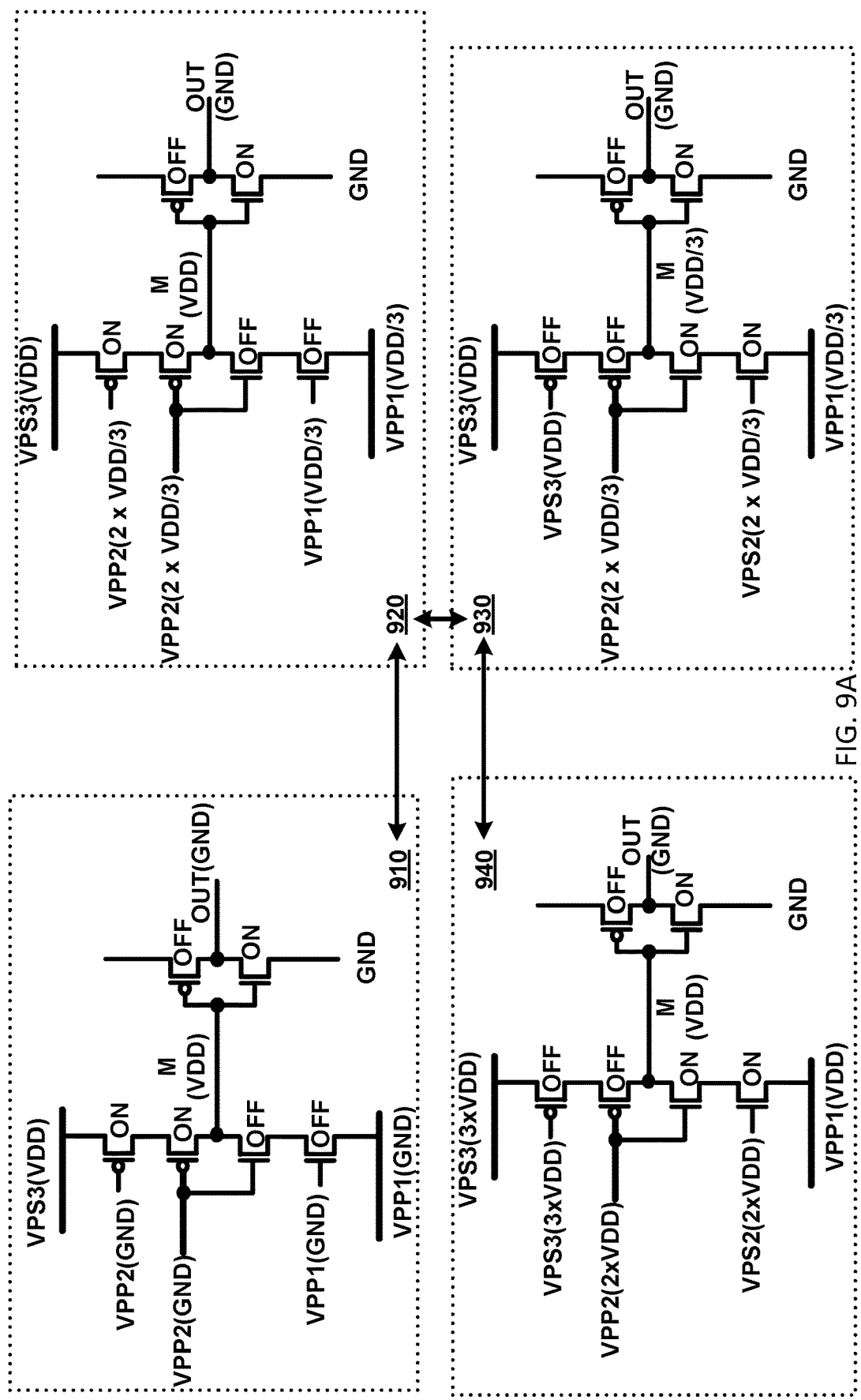
FIG. 9A shows a state diagram depicting the transitions of the settings of a high voltage switch according to embodiments of the present disclosure.
Figure 9B:
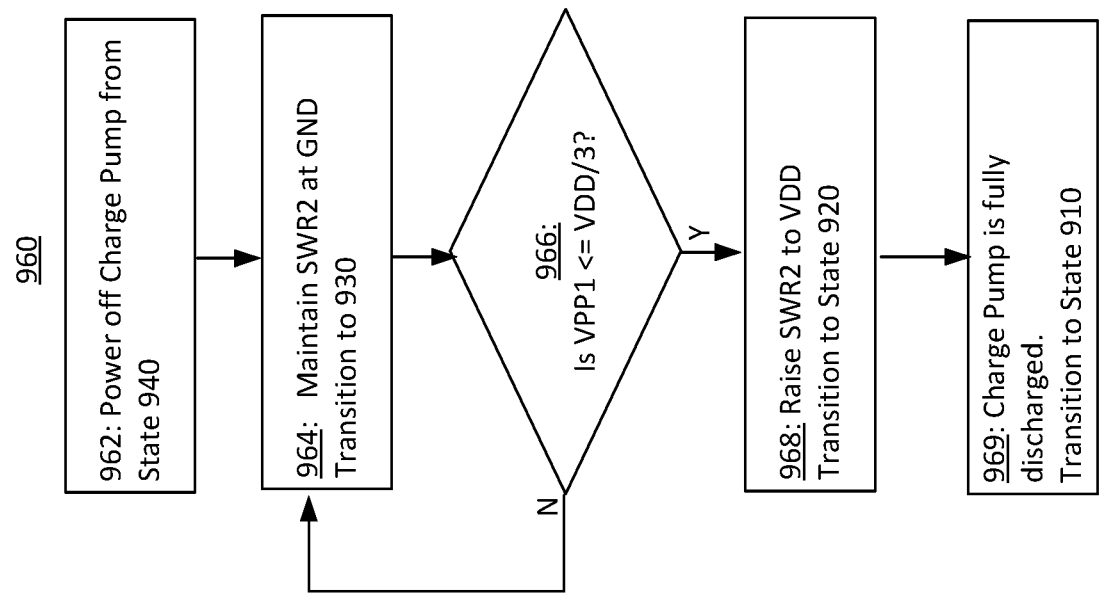
FIG. 9B shows flowchart for an operating method for transitioning the high voltage switch settings according to embodiments of the present disclosure.

FIGS. 9A and 9B show a state diagram and an exemplary method for operating the 4×VDD switch 800 depicted in FIGS. 8A-8C when transitioning between the standard read and program erase modes according to embodiments of the present disclosure. Although the 4×VDD switch 800 is designed so that none of the transistors are subject to over-stress voltages during either the standard read operation depicted in FIG. 8A or the program/erase operation in FIG. 8B, over-stress voltages may occur when transitioning between the standard read operation (when the charge pump is powered off) and the program/erase operation (when the charge pump is powered on) unless the transition moment is carefully designed. The method described in FIG. 9B prevents over-stress voltages during the transitions.

In embodiments, the states 910, 920, 930, and 940 of FIG. 9A depict the settings of components of the M-node driver stage (870 in FIG. 8A), and the transistors driving the OUT node of the output driver stage (880 in FIG. 8A). The M-node driver stage has VPS3 and VPP1 supply lines, and a string of PMOS and NMOS transistors arranged in a series between the supply lines and an M node line. The VPP2 supply line is coupled to the gate of the lower PMOS transistor and also the gate of the upper NMOS transistor. The M node line is coupled to one end to the junction between the lower PMOS transistor and the upper NMOS transistor. The other end of the M node line is coupled to the gates of the transistors driving the OUT node.

In embodiments, the transistors driving the OUT node are comprised of a PMOS transistor and an NMOS transistor coupled in a series, and an output line. The gate terminals of both the PMOS and NMOS transistors are coupled to an end of the M node line. The output line is coupled to the junction where the PMOS transistor and NMOS transistors are coupled. The word line signal, the final output of the 4×VDD switch, is carried through the output line.

In FIG. 9A, a standard read state 910 depicts the settings on the M-node driver stage and the OUT node ready for a standard read operation depicted in FIG. 8A according to embodiments of the present disclosure. In 910, the charge pump is powered off. Therefore, the VPS3 line is set at a VDD voltage, and the VPP1 line and VPP2 line are set to ground (indicated by GND). The SWR2 input to the second latch stage 860 is set to VDD and the latches may be biased to provide the VPP2 line voltage (in this case a ground voltage GND) to the gate terminal of the upper PMOS transistor of the M node driver, and the VPP1 line voltage (also GND) to the gate terminal of the lower NMOS transistor. In embodiments, the gate terminals of the lower PMOS transistor and the upper NMOS transistor are coupled directly to the VPP line to receive GND. Therefore, the PMOS transistors are set ON and the NMOS transistors are set OFF. The M node is charged to the VPS3 level (VDD). Due to the VDD voltage on the M node, in the OUT node, the NMOS transistor is ON and the PMOS transistor is OFF. The OUT node is pulled to ground through the NMOS transistor.

In embodiments, the transition from state 910 to state 920 occurs at the moment when the VPP1 level is boosted up to around VDD/3 level after the charge pump is powered on. The VPP1 and VPP2 voltages begin to increase from ground level once the charge pump is powered on.

In FIG. 9A, state 920 depicts the settings of the M-node driver stage and OUT node at a first transition state according to embodiments of the present disclosure. In state 920, the input signals to the 4×VDD switch, SWR1, SWR2, EN, and SRD remain set as in FIG. 8A for the standard read operation, but the charge pump is powering on. The SWR2 input is still at VDD and the latches are still biased in the same manner as state 910. Therefore, the gate terminals of the PMOS and NMOS transistors of the M node driver stage are coupled to the same supply lines as state 910. The PMOS transistors are ON and the NMOS transistors are OFF. Compared to state 910, the voltages on the VPP1 and VPP2 supply lines have increased.

Figure 9B:
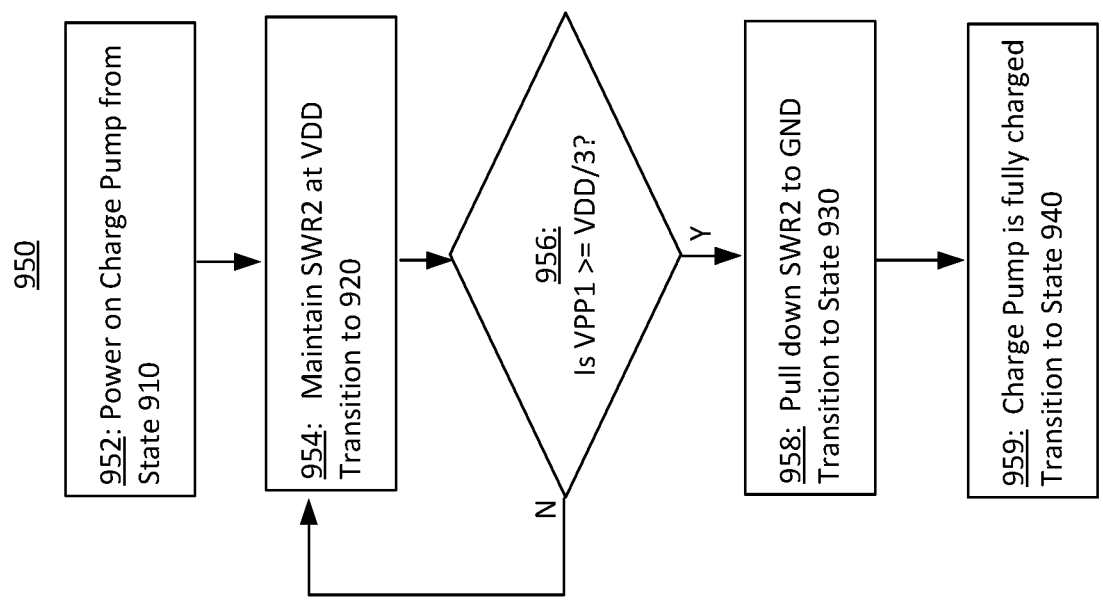

In embodiments, when the voltage levels on the line VPP1 reaches one third of the VDD voltage (VDD/3), VPP2 reaches two thirds of VDD (2×VDD/3) and VPS3 is still at VDD. The M node still is charged at VDD from VPS3 through the PMOS transistor string of the M-node driver stage. The OUT node is still pulled to ground through its NMOS transistor. In the embodiments, when the VPP1 reaches VDD/3, as depicted in FIG. 9, the transition from state 920 to 930, a second transition state, may be initiated. Without this transition, the M node may charge greater than VDD from the VPS3 through the PMOS transistor string of the M node driver stage, since VPS3 is about to exceed VDD.

In embodiments, the transition from 920 to 930 is initiated by pulling down the SWR2 signal from VDD to GND. This changes the bias conditions of the latches in the second latch stage 860, which switches the inputs to the gate terminals of transistors of the M-node driver stage.

In FIG. 9A, state 930 depicts the settings of the M-node driver stage and OUT node at a second transition state according to embodiments of the present disclosure. In the M-node driver stage, the gate terminal input of the upper PMOS transistor is switched from VPP2 (2×VDD/3) to VPS3 (VDD). The gate terminal input of the lower NMOS transistor is also switched, from VPP1 (VDD/3) to VPS2 (2×VDD/3). Thus, the PMOS transistors are set OFF, and the NMOS transistors are set ON. In this manner, in the second transition state 930, the M node pulled down to VDD/3 through the NMOS transistor string.

The transition from state 930 to 940 occurs when the charge pump continues to power on and the voltages on the supply lines continue to increase.

State 940 depicts the settings of the M-node driver stage and OUT node when the charge pump is fully powered for the program/erase operation according to embodiments of the present disclosure. The gate terminal inputs to the PMOS and NMOS transistor strings of the M-node driver stage are the same as in state 930. The voltage levels on the VPP1 and VPP2 reach VDD and 2×VDD respectively. VPS2 is also at 2×VDD and VPS3 is at 3×VDD. The PMOS transistors are OFF and NMOS transistors are ON. From the program/erase state 940, the 4×VDD switch is ready for the program/erase operation depicted in FIG. 8B, or the verify-read operation depicted in FIG. 8C.

The opposite transitions occur when the charge pump is powered down from the program/erase state 940. The transition to 930 occurs when voltage levels on the supply lines decrease as the VPP1, VPP2, VPS2 and VPS3 lines are discharged through a discharge circuit. Once the VPP1 voltage reaches VDD/3, the transition to state 920 is safely initiated by raising SWR2 to VDD, since VPS3 level is discharged enough down to around VDD level which does not overstress the transistors driving the OUT node. The transition to 910 occurs from 920 when the charge pump is completely powered off.

If the transition from the first transition state 920 to the second transition state 930 (or the opposite transition from 930 to 920) is initiated when the VPP1 voltage is substantially greater than VDD/3, the voltage on VPS3 may be substantially greater than the VDD level. Then, with the transition state 920, the M node may have a higher voltage than VDD. This may over-stress the transistors of the OUT node.

FIG. 9B shows flowcharts 950 and 960 of illustrative processes for operating the 4×VDD 800 according to embodiments of the present disclosure. The flow charts follow the state diagram of FIG. 9A. Flowchart 950 illustrates the process when the charge pump is powered on at Step 952. In step 954, SWR2 is unchanged as the voltages on VPP1 through VPP4 begin to be elevated. In Step 956, the VPP1 voltage is compared against VDD/3. If it has not yet reached VDD/3, the process stays at 954, maintaining SWR2 at VDD. If VPP1 equals or exceeds VDD/3, the process advances to step 958, pulling SWR2 to GND and transitioning to 930. The process reaches step 959 when the charge pump to be fully charged. The state transitions to 940, and the switch 800 is ready for program/erase or verify read operations.

Flowchart 960 illustrates the opposite process, starting when the charge pump is powered off from state 940 in step 962. In step 964, the state changes to 930. In step 966, the VPP1 voltage level is compared against VDD/3. If VPP1 has not decreased to VDD/3, the process stays at 964, maintaining state 930. If VPP1 drops below VDD/3, the process advances to step 968, and transitions to state 920 by raising SWR2 to VDD. The process advances to step 969 when the charge pump fully discharges. The state transitions to 910, and the switch 800 is ready for standard read operations.

Figure 10:
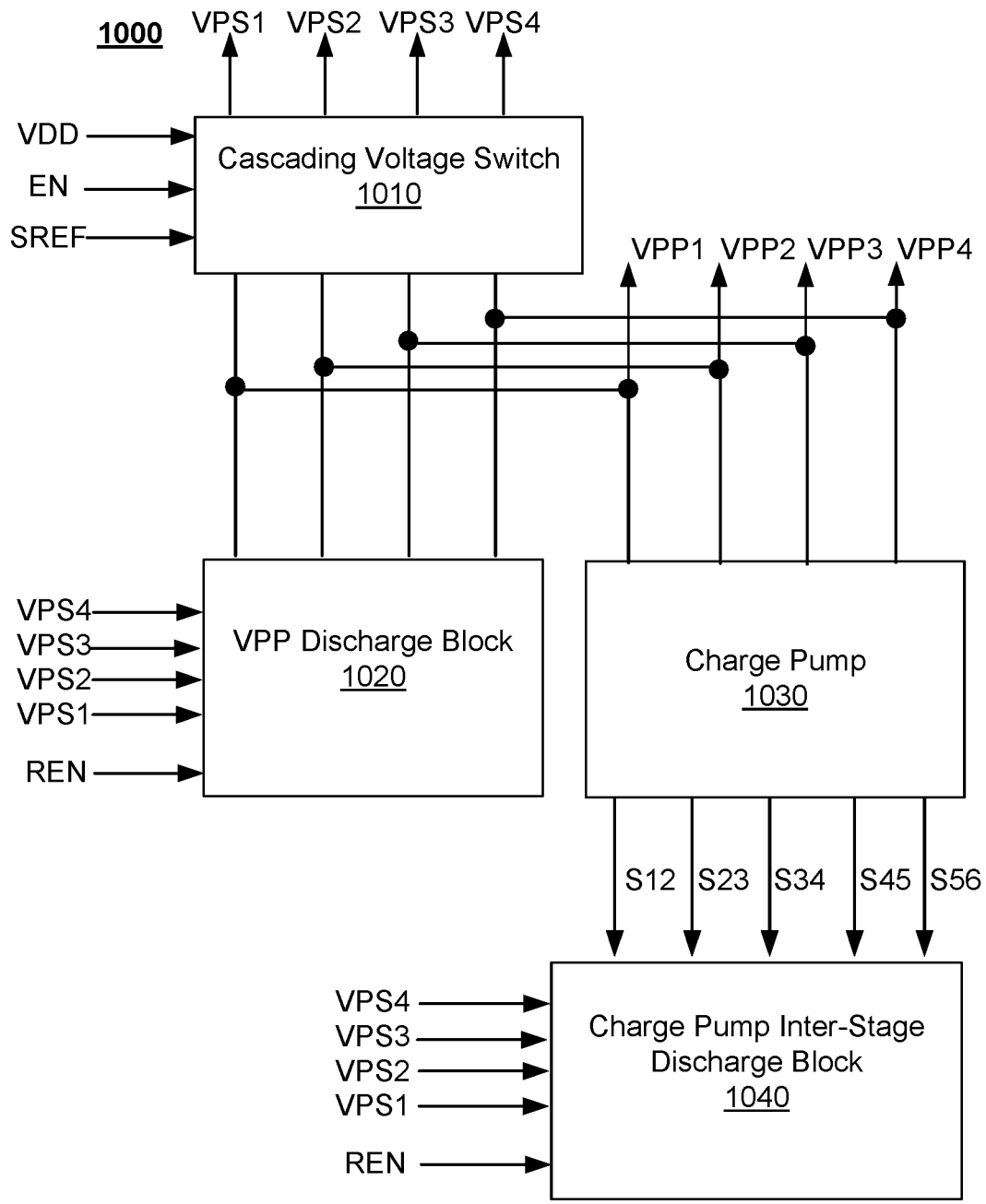
FIG. 10 shows a block diagram for a charge pump and cascaded voltage switch used to generate the high voltage signals for an array of flash memory cells according to embodiments of the present disclosure.

FIG. 10 shows a schematic diagram of charge pump and cascaded voltage switch 1000 according to embodiments of the present disclosure. The charge pump and cascaded voltage switch 1000 may be used as the charge pump and cascaded voltage switch 410 in FIG. 4. In embodiments, charge pump 1030 provides output on the VPP1 through VPP4 lines. When the charge pump 1030 is powered off the VPP1 through VPP4 outputs ground level voltages. When the charge pump is powered on, the voltages on VPP1 through VPP4 rise to VDD, 2×VDD, 3×VDD, and 4×VDD respectively. The VPP1 through VPP4 lines also provide input to the cascaded voltage switch 1010.

In embodiments, the cascaded voltage switch 1010 also receives as inputs a VDD voltage input signal, an enable signal EN, and a reference level voltage signal SREF. The cascaded voltage switch 1010 provides outputs VPS1 through VPS4. When the charge pump is off, and VPP1 through VPP4 voltages are at ground level, VPS1 through VPS4 output VDD voltage signals. When the charge pump is turned on, the cascaded voltage switch 1010 connects the VPS1 with VPP1, VPS2 with VPP2, VPS3 with VPP3, and VPS4 with VPP4 in sequence. This way the voltage of the VPS1 through VPS4 outputs become the same as those of VPP1 through VPP4.

In embodiments, when the charge pump is powered off, the cascaded voltage switch returns VPS1, VPS2, VPS3, and VPS4 outputs to the VDD output in sequence. The VPS1 through VPS3 outputs are provided to the VPP discharge block 1020 and the charge pump inter-stage discharge block 1040. The high voltages on the VPP1 through VPP4 lines may be discharged safely through the VPP discharge block 1020 to ground level. VPP discharge block 1020 prevents overstress on the other components when high voltage signals (e.g., 4×VDD on VPP4) are discharged.

In embodiments, charge pump inter-stage discharge block 1040 discharges the high voltages on the inter-stage couplings of the charge pump. Similar to the VPP discharge block 1020, the high voltage signals within the charge pump 1030 may be discharged safely without overstressing other components.

Figure 11:
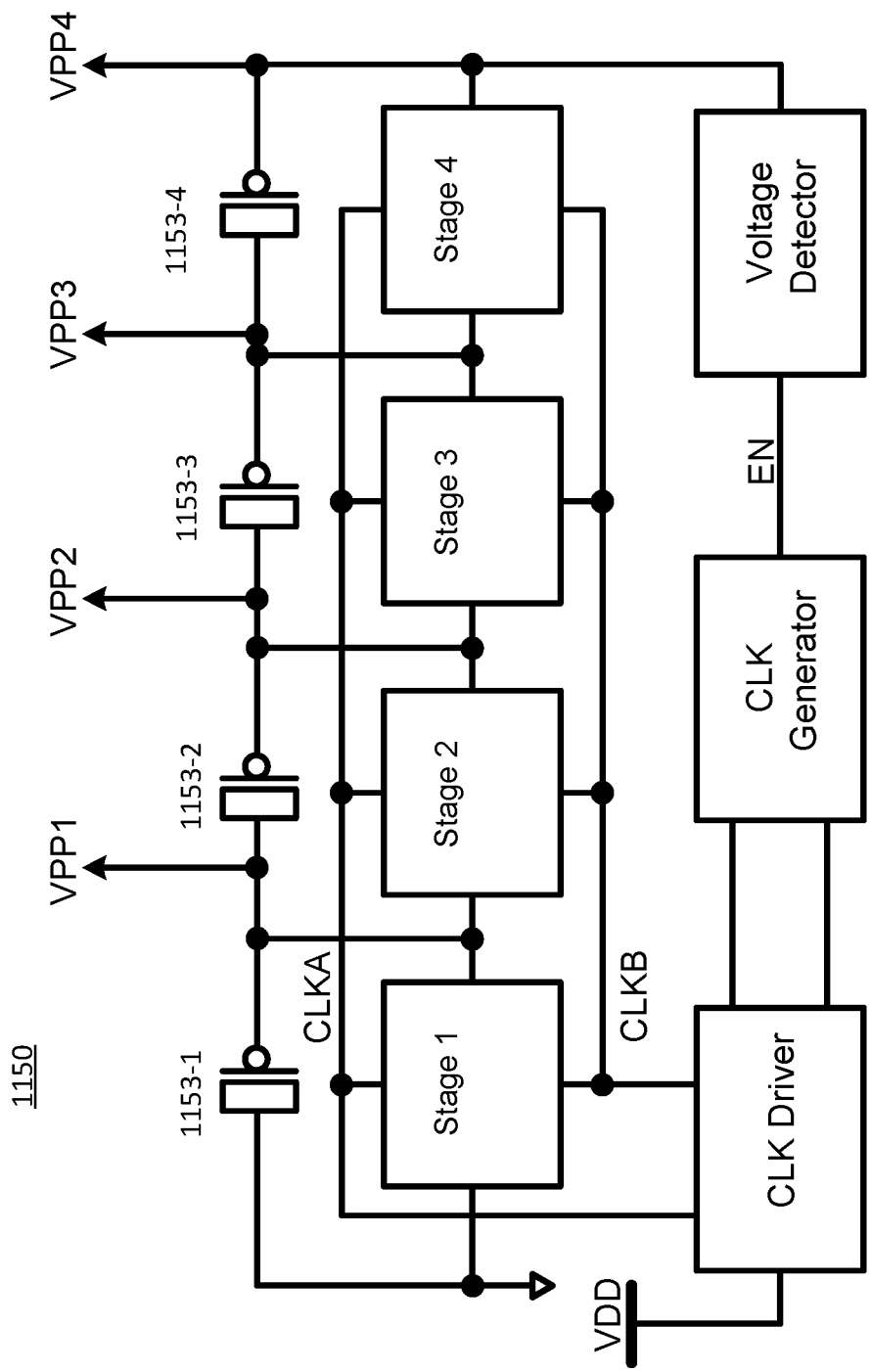
FIG. 11 shows a schematic diagram for a prior art charge pump that may be used in FIG. 10.

FIG. 11 shows a prior art charge pump 1130. Typically, the prior art charge pump is comprised of four stage charge pumps connected in a series, a clock driver, a pumping clock generator, a voltage detector, and a string of four decoupling capacitors 1153-1 through 1153-4 connected in a series. The input to the stage 1 charge pump is a ground level voltage. Each subsequent stage receives as an input, the output from the previous stage, and each stage charge pump may increase the voltage of the signal. The stage 4 charge pump output is coupled to the VPP4 output. The clock generator is coupled to the clock driver. The clock driver supplies CLKA and CLKB signals to each of the stage charge pumps.

In the prior art charge pump 1130 of FIG. 11, the first decoupling capacitor 1153-1 connected to the ground voltage. Between each of the decoupling capacitors (e.g. 1153-1 and 1153-2), there are two junctions. The first junction is connected to each of the inter-stage connections. Thus, as depicted in FIG. 11, the output from the stage 1 charge pump is connected to a junction between the decoupling capacitors 1153-1 and 1153-2, the stage 2 output is connected to a junction between decoupling capacitors 1153-2 and 1153-3, the third stage output is connected to a junction between the decoupling capacitors 1153-3 and 1153-4. The VPP1 through VPP3 outputs are connected to the other junction between each of the decoupling caps 1153-1 to 1153-4. In this manner, output from the stage 1 is coupled with VPP1, the stage 2 output with VPP2, the stage 3 output to VPP3, and as previously described, the final stage 4 output is coupled to VPP4.

In FIG. 11, the final fourth stage output coupled to the VPP4 output is provided to the voltage detector. The voltage detector controls an enable signal EN to the clock generator and may gate on/off the pumping clock generator.

When charge pump 1130 is powered off, the VPP1 through VPP4 output voltages are at ground level. When the charge pump is powered on, each staged charge pump raises the voltages of the output of the previous stage.

A problem with the prior art charge pump of FIG. 11 is that each stage charge pump has an efficiency loss. Therefore, the VPP4 output does not reach 4×VDD with four stages. Additional pumping stages may be added with repeated stage connections, but to reach 4×VDD levels used in the program/erase operations of the PWL and WWL word lines in FIG. 8B of embodiments, eight pumping stages and outputs VPP1 through VPP8 would be required. The power consumption would be high, and the charge pump would occupy a much larger area on a chip.

Figure 12:
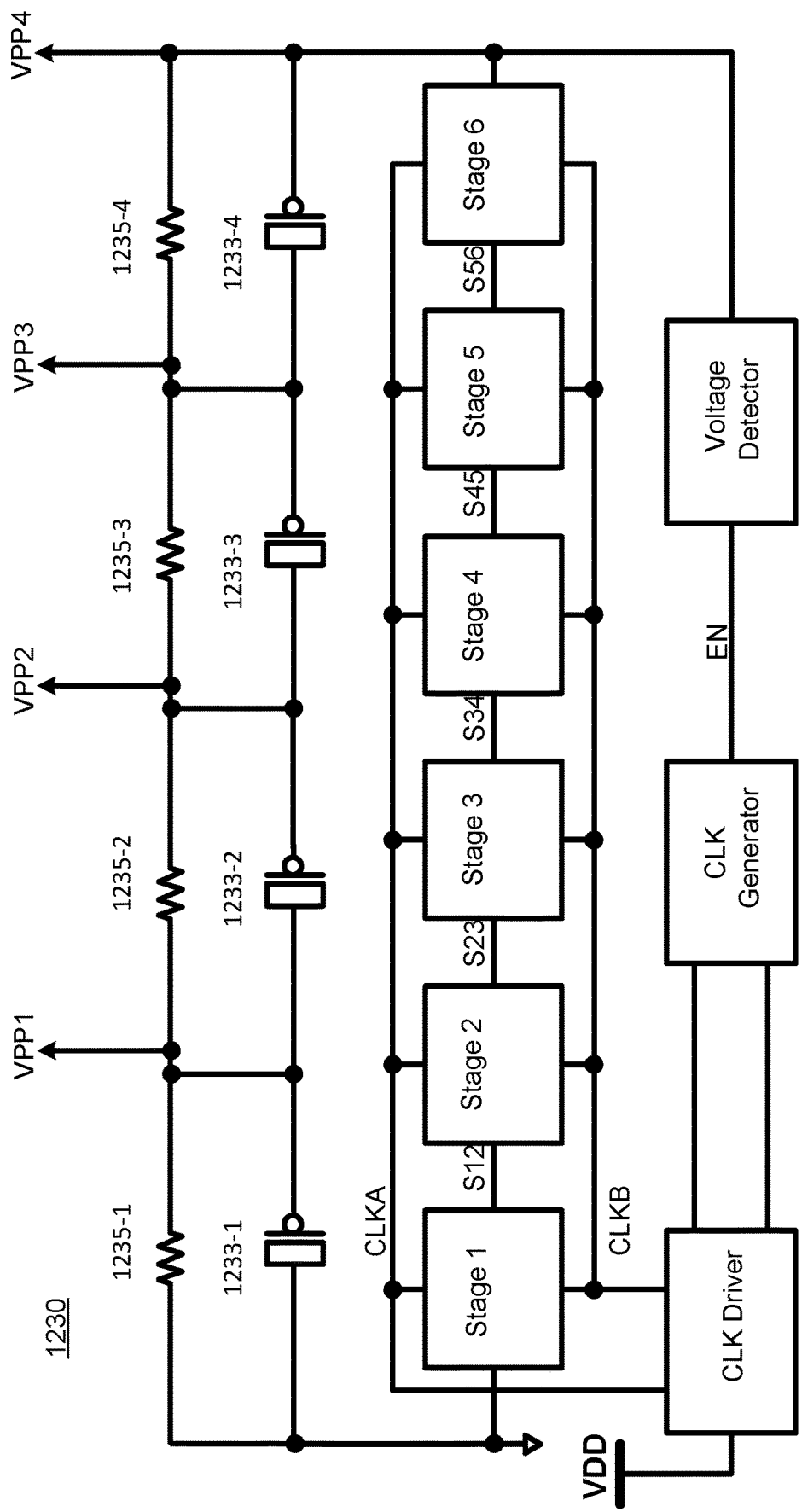
FIG. 12 shows a schematic diagram for a charge pump that may be used in FIG. 10 according to embodiments of the present disclosure.

FIG. 12 shows a charge pump 1230 according to embodiments of the present disclosures that may be used as the charge pump in 1030. Pump 1230 is similar to prior art pump 1130 in that it has a voltage detector, clock generator and clock driver and stages of charge pumps coupled in a series. The stage 1 input is connected to ground, and the final stage output (e.g., output from stage 6) is coupled to the VPP4 output. But, unlike the prior art charge pump 1130, VPP1 through VPP4 outputs are not directly coupled to the inter-stage outputs on the decoupling capacitors string.

In embodiments, the decoupling capacitor string 1233-1 through 1233-4 is coupled to the ground level voltage at decoupling capacitor 1233-1, and the VPP4 output at 1233-4. A resistor string 1235-1 through 1235-4 is also coupled to the ground at 1235-1 and to the VPP4 output at 1235-4. The four resistors connected in series divides the voltage level from ground to VPP4 into segments between the resistors as each resistor 1235-4 to 1235-1 causes the voltage to drop. VPP1 is coupled to the voltage segment between resistors 1235-1 and 1235-2, VPP2 is coupled to the voltage segment between 1235-2 and 1235-3, and VPP3 is coupled to the voltage segment between 1235-3 and 1235-4. Each corresponding voltage segment of the resistor string is coupled to a corresponding segment of the decoupling capacitor string (e.g., the segment between resistors 1235-1 and 1235-2 is coupled to the segment between the decoupling capacitors 1233-1 and 1233-2).

In charge pump 1230, the number of VPP outputs is not tied to the inter-stage voltages of the pumps in embodiments according to the present disclosure. Additional pump stages may be added to obtain the desired output voltage at VPP4. In embodiments, charge pump 1230 may obtain 4×VDD voltage output with six pump stages, compared to eight pumps and VPP output stages in prior art pump 1130.

In embodiments, charge pump 1230 requires its own discharge block to safely discharge the elevated inter-stage voltages back to ground level when the charge pump is powered down.

Figure 13A:
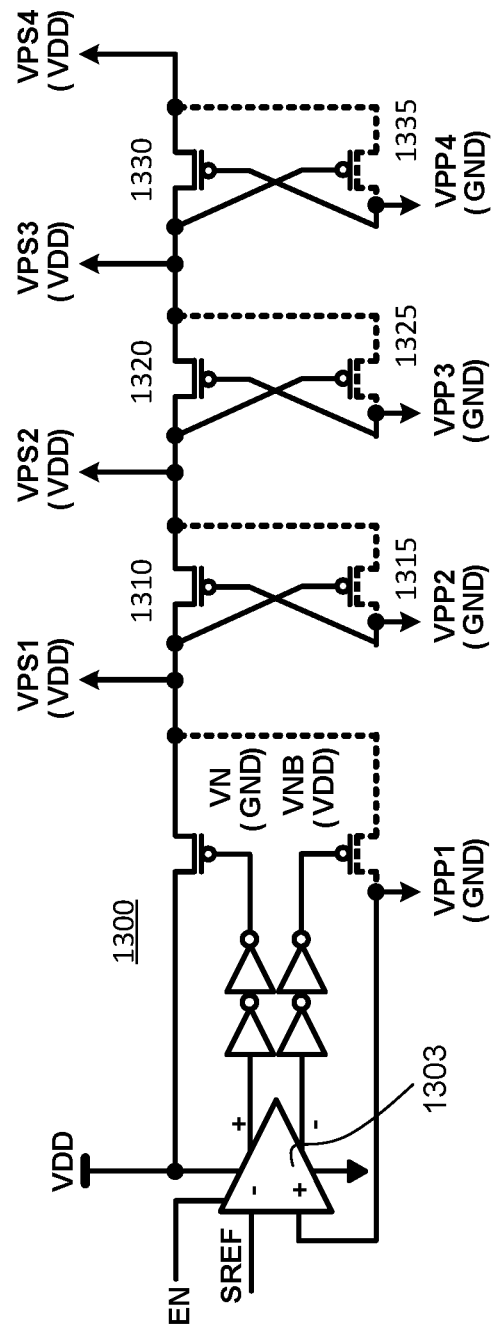
FIGS. 13A and 13B show schematic diagrams and exemplary settings for a cascaded voltage switch that may be used in FIG. 10 according to embodiments of the present disclosure.
Figure 13B:
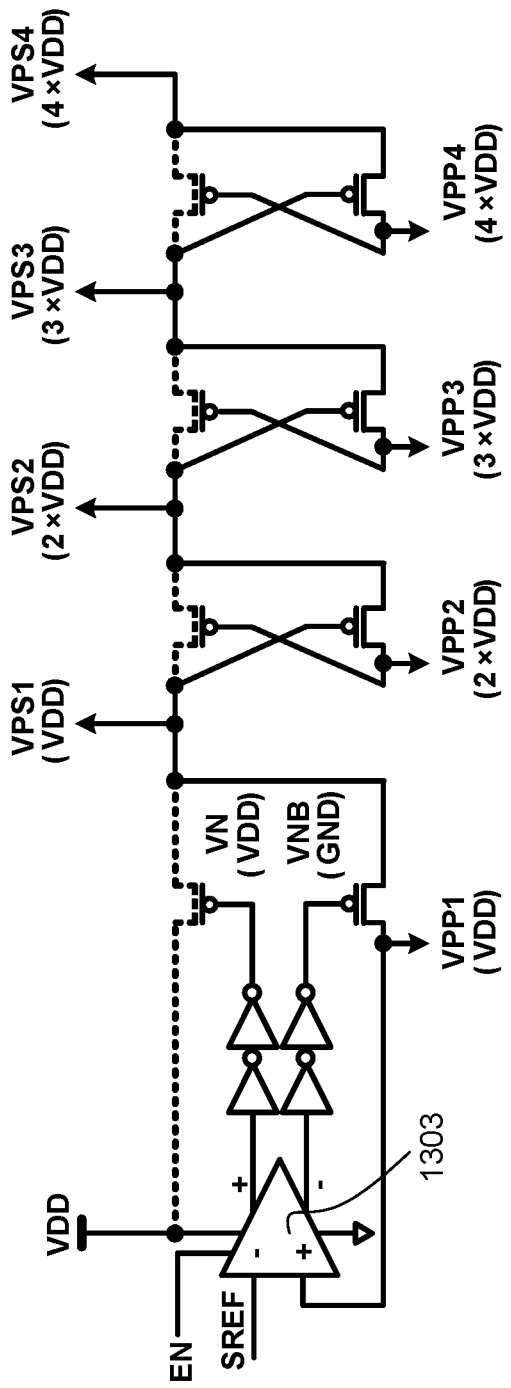

FIGS. 13A and 13B show schematic diagrams of a cascaded voltage switch 1300 according to embodiments of the present disclosure. Cascaded voltage switch 1300 represents the cascaded voltage switch 1010 in FIG. 10. The PMOS transistors 1310 through 1335 are arranged in a cascade. The voltage switch receives as inputs a VDD signal, and EN signal, and a SREF reference voltage signal, and the VPP1 through VPP4 inputs from the charge pump. Voltage switch outputs are the VPS1 through VPS4 supply lines.

The EN signal activates or deactivates a comparator 1303 that compares the VPP1 signal to a SREF signal when it is active. The comparator 1303 outputs are coupled to VN and VNB switches that may toggle the coupling of the VPS1 output between the VDD signal and VPP1. When the charge pump is powered up, VPS1 is decoupled from VDD and coupled to VPS1. Subsequently, through the arrangement of the PMOS transistors 1310 to 1335, the VPS2, VPS3 and VPS4 are also switched from VDD to VPP2, VPP3, and VPP4 (and thus also become elevated) in a sequence. When the charge pump is powered down, the VPS1 is decoupled from VPP1 and coupled to VDD. The PMOS transistors 1310 to 1335 then return VPS2, VPS3, VPS4 back to VDD in a sequence.

FIG. 13A shows the settings for the cascaded voltage switch 1300 when the charge pump 1230 is powered off (a low voltage mode). In embodiments, when the charge pump is off, the VPP1 through VPP4 inputs to the switch are at ground level and VPS1 gets a VDD signal. The PMOS transistors 1310, 1320 and 1330, the gate terminals receive ground voltage signals from VPP2, VPP3, and VPP4 while the source terminals receive VDD signals from VPS1 through VPS3 in sequence. The gate terminal voltage is lower and therefore, PMOS 1310, 1320, and 1330 turn on. The PMOS transistors 1315, 1325 and 1335 receive a ground signal at their sources and a VDD signals at their gates and are thus turned off. The VPS1 through VPS4 and VPP1 through VPP4 voltage levels are at the levels for the standard read operation in FIG. 8A.

FIG. 13B shows the settings when the charge pump is powered on (high voltage mode) according to embodiments of the present disclosure. In embodiments, when the charge pump is powered on and VPP1 through VPP4 inputs have elevated voltages and VPS1 is coupled to VPP1 instead of VDD. The PMOS transistors 1310, 1320, and 1330 each have a higher gate voltage than source and turn off. The PMOS transistors 1315, 1325, and 1335 on the other hand have higher source voltages than gate voltages and therefore turn on. Thus, VPS2 is coupled to VPP2, VPS3 to VPP3 and VPS4 to VPP4 in a sequence. The VPS1 through VPS4 and VPP1 through VPP4 voltages levels rise to the levels for the program/erase and verify read operations in FIGS. 8A and 8C.

Figure 14A:
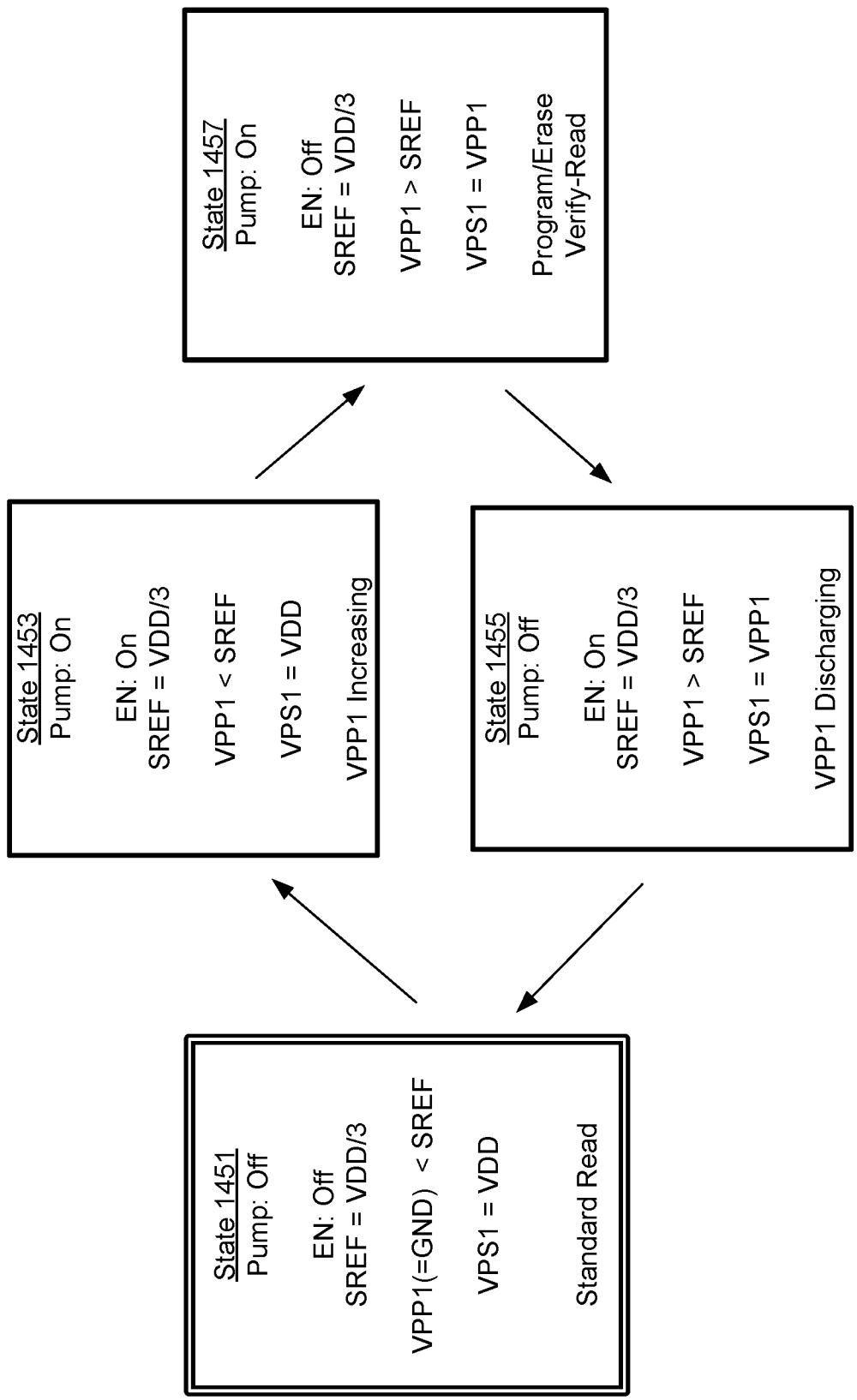
FIG. 14A shows a state diagram depicting the transitions of the settings of a cascaded voltage switch according to the embodiments of the present disclosure.

FIG. 14A shows a state diagram of an operating method for transitioning the cascaded voltage switch 1300 between the low voltage modes and high voltage modes according to embodiments of the present disclosure. In embodiments, state 1451 corresponds to the standard read mode where the charge pump is off. The EN for the comparator 1303 is off to save power. The SREF voltage is one third of VDD (VDD/3). VPP1 is at ground level, and VPS1 is set to VDD.

The transition to state 1453 occurs when the charge pump is powered on. In State 1, the EN input is turned on, and the comparator 1303 compares the VPP1 voltage with SREF. Since the charge pump has just turned on VPP1 may remain less than SREF. VPS1 continues to receive the VDD signal.

The transition to state 1457 occurs when VPP1 exceeds SREF. Once the state is transitioned to the State 1457, the EN is turned off to save power. In State 2, the VPS1 is switched to VPP1. VPS2 through VPS4 are also coupled to their corresponding VPP line. When the VPP and VPS lines are completely elevated, program/erase operations may be executed.

The transition to state 1455 occurs when the charge pump is powered off. The EN input is activated and the comparator 1303 compares the VPP1 and SREF voltages. Since the power has just been turned off, the VPP1 has not discharged below the SREF level, so the VPSn lines are still coupled with the VPPn lines.

When VPP1 is lower than SREF, the transition to state 1451 occurs. The VPS1 is switched to the VDD signal, and EN is turned off.

Figure 14B:
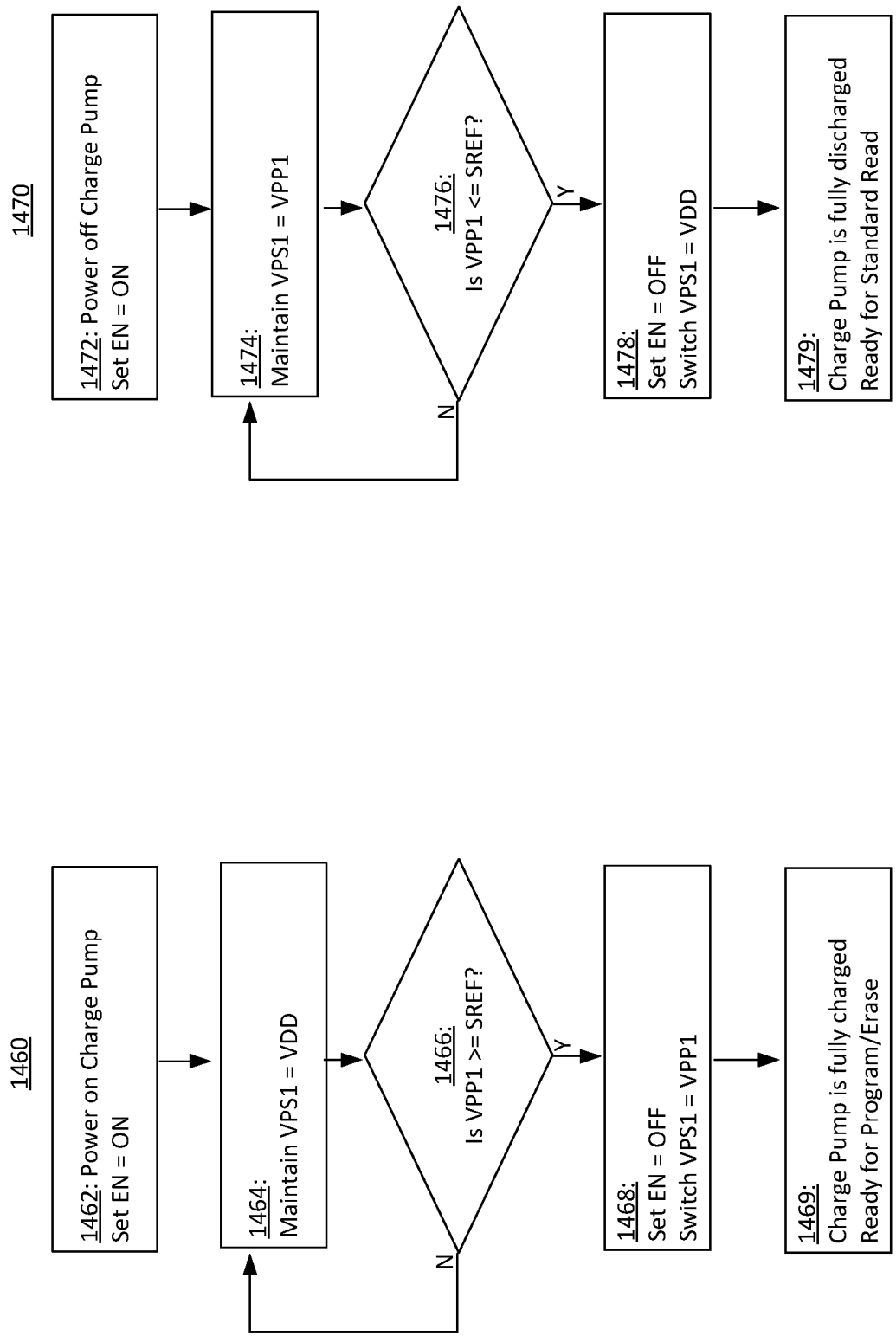
FIG. 14B shows a flowchart for an operating method for transitioning the settings of a cascaded voltage switch according to the embodiments of the present disclosure.

FIG. 14B shows flowcharts 1460 and 1470 of illustrative processes for operating the cascaded voltage switch 1300 according to embodiments of the present disclosure. The flow charts follow the state diagram of FIG. 14A. Flowchart 1460 illustrates the process starting when the charge pump is powered on and EN is set to ON at step 1462. The state transitions from 1451 to 1453 as the pump begins charging. In step 1464, VPS1 is kept coupled to the VDD source. VPP1 through VPP4 begin to be elevated. In Step 1466, the VPP1 voltage is compared against SREF (=VDD/3). If VPP1 has not yet reached SREF, the process stays at 1464, maintaining VPS1 coupled to VDD. The switch maintains state 1453.

If VPP1 equals or exceeds VDD/3, the process advances to step 1468, setting EN to OFF and switching VPS1 to be coupled to VPP1. This transitions the state to 1457. The process advances to step 1469. When the charge pump is fully charged, the switch 1300 is ready for program/erase or verify read operations.

Flowchart 1470 illustrates the opposite process, starting when the charge pump is powered off and EN is set to ON in step 1472. The state transitions from 1457 to 1455 as the pump begins discharging. In step 1474, VPS1 is kept coupled to VPP 1. In step 1476, the VPP1 voltage level is compared against SREF. If VPP1 has not reached to SREF, the process stays at 1474, maintaining state 1455. If VPP1 reaches or has dropped below SREF, the process advances to step 1478. The EN is turned OFF and VPS1 is switched to VDD, and the state transitions to 1451. When the charge pump fully discharges, the switch 1300 is ready for standard read operations.

Figure 15A:
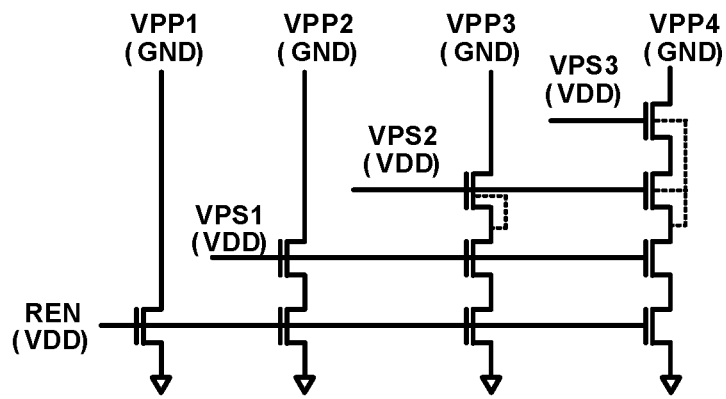
FIGS. 15A and 15B show schematic diagrams and exemplary settings for a VPP discharge block when the charge pump is powered off and powered on according to embodiments of the present disclosure.
Figure 15B:
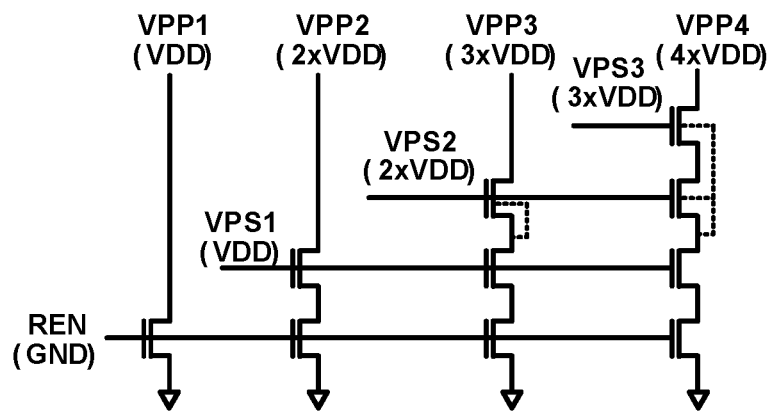

FIGS. 15A and 15B show schematic diagrams of a VPP discharge block 1420 according to embodiments of the present disclosure. The VPP discharge block 1420 may be used as a VPP discharge block 1020 in FIG. 10. The discharge block 1420 may be coupled to the VPS1 through VPS4 supply lines from a cascaded voltage switch 1010.

FIG. 15A shows a schematic diagram of VPP discharge block 1420 when the charge pump (e.g., 1230) is off according to embodiments of the present disclosure. In embodiments, high voltages on lines VPP1 through VPP4 are discharged to ground level through strings of NMOS transistors. The NMOS transistors are coupled to a REN (read enable) and VPS1 through VPS3 at their gate terminals. When the charge pump is off, the REN is set to VDD and the bottommost NMOS transistors are turned on. When the charge pump is powered down, the VPS1 through VPS3 are changed to VDD in sequence. The NMOS transistors are activated in the corresponding sequence as their gate terminals are set to VDD. Therefore, the high voltage lines may discharge safely without causing voltage stress.

FIG. 15B shows a schematic diagram of the VPP discharge block 1420 and the gate and source terminal voltages when the charge pump (e.g., 1230) is on according to embodiments of the present disclosure. The NMOS transistors are turned off as REN is set to GND and the gate voltage on the NMOS transistors is lower than the drain voltage.

Figure 16A:
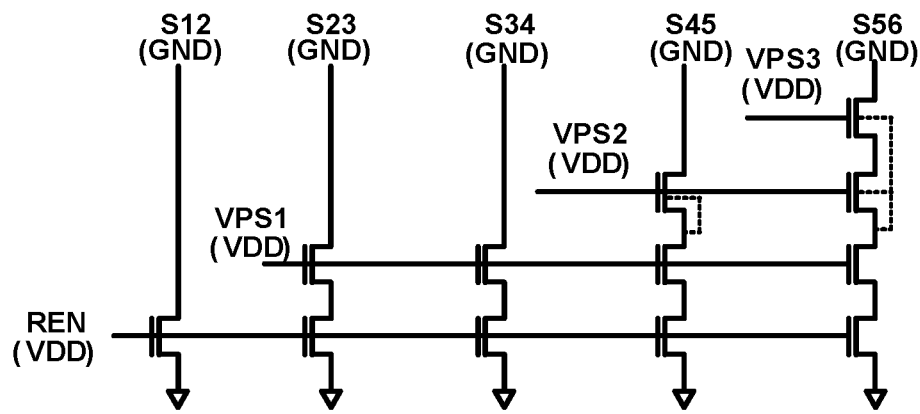
FIGS. 16A and 16B show schematic diagrams and exemplary settings for a charge pump inter-stage discharge block when the charge pump is powered off and powered on according to embodiments of the present disclosure.
Figure 16B:
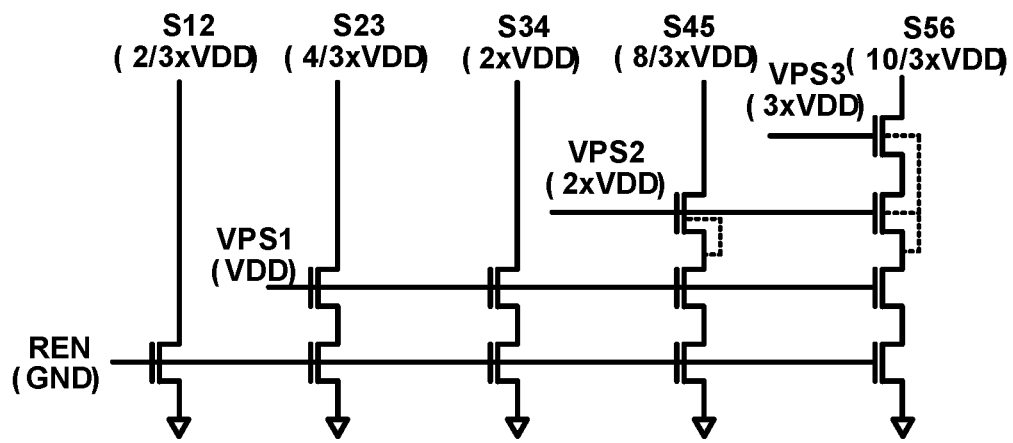

FIGS. 16A and 16B show schematic diagrams of the charge pump inter-stage discharge block 1440 when the charge pump 1230 is powered off and when it is powered on according to embodiments of the present disclosure. According to the present disclosure, the number of NMOS stacks are designed to divide high voltage levels of the inter-state high voltage nodes of the charge pump (S12, S23, S34, S45, S56) when the charge pump is powered on. For example, by having two NMOS transistors in series, the divided level of the S23 and S34 (=4/3×VDD and 2×VDD) by around two is driven to the each of NMOS transistor. By having three and four NMOS transistors in series, the divided level of the S45 and S56 (=8/3×VDD and 10/3×VDD) by around three and four is driven to the each of NMOS transistor. To avoid the junction breakdown, the body of the transistors of which the gates are driven by VPS2 and VPS3 signals are connected to the drain terminals of the transistors of which the gates are driven by VPS1 signal. The number of NMOS stacks are minimized to save area, as long as the divided voltage level to drive each transistor is below VDD. The gate bias settings of NMOS stacks are similarly controlled to the VPP discharge block 1420 depicted in FIGS. 15(A) and 15(B).

Figure 17:
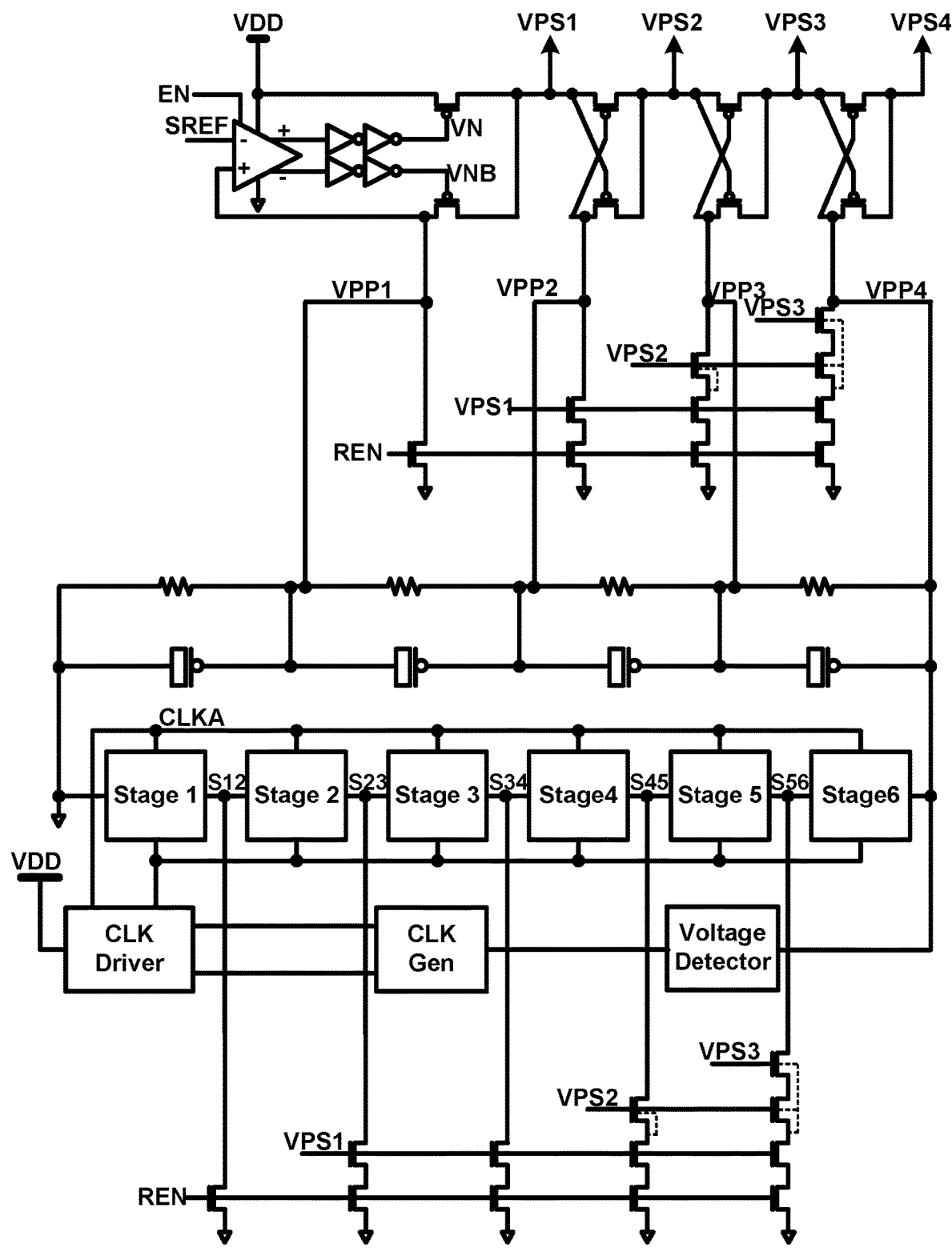
FIG. 17 shows an exemplary circuit diagram of FIG. 10 using the charge pump of FIG. 12 according to embodiments of the present disclosure.

FIG. 17 shows an exemplary circuit diagram of FIG. 10 using the charge pump of FIG. 12 according to the embodiments of the present disclosure. FIG. 17 illustrates how the components in FIG. 10 may be connected in embodiments.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A charge pump circuit for outputting a plurality of boosted and divided voltages, the charge pump circuit comprising:
   a plurality of charge pump stages for outputting a boosted voltage, each stage including a unit pump circuit;
   a first set of output nodes consisting of a plurality of intermediate output nodes and a common output node, wherein the charge pumps stages are configured to supply the boosted voltage on the common output node; and
   a voltage divider circuit including:
   one or more unit voltage divider circuit for dividing the boosted voltage and outputting a plurality of divided voltages; and
   a plurality of impedance elements connecting a pair of a second set of output nodes such that the divided voltages are provided on a subset of the second set of output nodes,
   wherein the intermediate output nodes of the first set of output nodes are connected to a first voltage discharging circuit configured to discharge the voltages on the first set of output nodes; and,
   wherein the first discharging circuit comprises a plurality of discharge blocks in parallel sharing an enable signal line, each discharge block including a transistor string with one or more series-connected NMOS transistors, wherein specified blocks are connected to one or more power supply lines.

2. The charge pump circuit according to claim 1, wherein a number of the charge pump stages is different from a number of the second set output nodes.

3. The charge pump circuit according to claim 1 further comprises a clock control circuit for supplying at least one clock signal to the charge pump stages, the clock control circuit comprising:
   a boost voltage detector configured to receive the boosted voltage from the charge pump stages and generate a voltage pumping enable signal in response to when the boosted output voltage is lower than a reference voltage specified;
   a clock generator for generating one or more clock signal in response to the voltage pumping enable signal; and
   a clock driver configured to receive the clock signal and provide driving signals to the charge pump stages in response to the clock signal.

4. The charge pump circuit according to claim 1, wherein the common output node supplies the boosted voltage to the voltage divider circuit.

5. The charge pump circuit according to claim 1, wherein a number of NMOS transistors in the string is dependent on a magnitude of voltage of the output node connected to the string such that a divided voltage on each transistor prevents overstress applied to the transistor.

6. The discharge pump circuit according to claim 1, wherein a plurality of the N-MOS transistors are electrically coupled in series between a source of a first transistor and a drain of a second transistor when two or more of the NMOS transistors are connected in the string.

7. The charge pump circuit according to claim 1, wherein each of the second set of output nodes is connected to a second voltage discharging circuit configured to discharge the voltages on the second set of output nodes; and,
wherein the second voltage discharging circuit comprises a plurality of discharge blocks in parallel sharing an enable signal line, each discharge block including a transistor string with one or more series-connected NMOS transistors, wherein specified blocks are connected to one or more power supply lines.

8. The charge pump circuit according to claim 7, wherein a number of NMOS transistors in the string is dependent on a magnitude of voltage of the node connected to the string such that a divided voltage on each transistor prevents overstress applied to the transistor.

9. The charge pump circuit according to claim 7, wherein each of the second set of output nodes is connected to a cascading voltage switching circuit having a corresponding plurality of PMOS transistor pairs.

10. The charge pump circuit according to claim 9, wherein the PMOS transistor pairs are configured to receive the boosted and divided voltages from the second set of output nodes and connect appropriate voltage levels on the power supply lines.

11. The charge pump circuit according to claim 10, wherein the plurality of a second set of output nodes and the power supply lines are connected to a high voltage switching circuit comprising:

i) a first latch stage connected to specified ones of the second set of output nodes and the power supply lines from the charge pump circuit, for creating a first control signal connected to an output driver stage;

ii) a second latch stage connected to specified ones of the second set of output nodes and specified ones of the power supply lines, for creating a second set of control signals connected to an intermediate-node driver stage and a third set of control signals connected to the output driver stage;

iii) an intermediate-node driver stage connected to specified ones of the second set of output nodes and a specified one of the power supply lines, for creating a fourth control signal connected to the output driver stage; and iv) an output driver stage connected to a specified one of the second set of output nodes and specified ones of the power supply lines, for delivering a switched voltage level on a switch output node.

12. The charge pump circuit according to claim 11, wherein the switch output node is connected to a device configured to (i) perform a high voltage mode operation in response to when the charge pump circuit is turned on and (ii) perform a low voltage mode operation in response to when the charge pump circuit is turned off.

13. The charge pump circuit according to claim 12, wherein the device is a flash memory device configured to perform a high voltage mode program operation, a high voltage mode erase operation, a high voltage mode verify operation, or a low voltage mode read operation.

* * * * *